US012309946B2

United States Patent
Cho et al.

(10) Patent No.: US 12,309,946 B2
(45) Date of Patent: May 20, 2025

(54) DISPLAY SUPPORT STRUCTURE AND ROLLABLE ELECTRONIC DEVICE HAVING THE SAME

(71) Applicant: SAMSUNG ELECTRONICS CO., LTD., Suwon-si (KR)

(72) Inventors: Sunggun Cho, Suwon-si (KR); Hwamok Pak, Suwon-si (KR); Jinwook Baik, Suwon-si (KR); Minyee An, Suwon-si (KR); Dongik Lee, Suwon-si (KR); Jinju Lee, Suwon-si (KR); Wonhee Choi, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 128 days.

(21) Appl. No.: 17/966,407

(22) Filed: Oct. 14, 2022

(65) Prior Publication Data
US 2023/0247783 A1    Aug. 3, 2023

Related U.S. Application Data

(63) Continuation of application No. PCT/KR2022/014944, filed on Oct. 5, 2022.

(30) Foreign Application Priority Data

Feb. 3, 2022  (KR) .................. 10-2022-0014150
Mar. 30, 2022  (KR) .................. 10-2022-0039498

(51) Int. Cl.
*H05K 5/02*    (2006.01)
*H04M 1/02*    (2006.01)
*H05K 5/00*    (2006.01)

(52) U.S. Cl.
CPC ........ *H05K 5/0217* (2013.01); *H04M 1/0268* (2013.01); *H05K 5/0086* (2013.01)

(58) Field of Classification Search
CPC .................. H05K 5/0017; H05K 5/0217
(Continued)

(56) References Cited

U.S. PATENT DOCUMENTS

| 8,711,566 B2 | 4/2014 | O'Brien |
| 9,195,272 B2 | 11/2015 | OBrien |

(Continued)

FOREIGN PATENT DOCUMENTS

| CN | 206004209 U | 3/2017 |
| CN | 111833743 A | 10/2020 |

(Continued)

OTHER PUBLICATIONS

International Search Report for PCT/KR2022/014944 dated Jan. 27, 2023.

(Continued)

*Primary Examiner* — Hung S. Bui
(74) *Attorney, Agent, or Firm* — CANTOR COLBURN LLP

(57) ABSTRACT

A rollable electronic device includes a display structure including a display area, a first housing fixed to the display structure, a second housing slidable with respect to the first housing and the display structure, a sliding driver which is in the first housing, and a tension transmitting member which is windable at the sliding driver, the tension transmitting member including a first end connected to the display structure and a second end connected the first housing. An opening operation includes the second housing sliding away from the first housing, expanding the display area, and the sliding driver winding the first end of the tension transmitting member, in a first rotational direction, and a closing operation includes the second housing sliding toward the first housing, contracting the display area, in the opening operation, the sliding driver winding the second end (Continued)

of the tension transmitting member, in a second rotational direction.

13 Claims, 23 Drawing Sheets

(58) Field of Classification Search
USPC .......................................... 361/807, 809, 810
See application file for complete search history.

(56) References Cited

U.S. PATENT DOCUMENTS

| | | |
|---|---|---|
| 10,938,970 B1 | 3/2021 | Lee et al. |
| 11,194,363 B2 | 12/2021 | Kim et al. |
| 11,206,322 B2 | 12/2021 | Cha et al. |
| 11,630,490 B2 | 4/2023 | Kim et al. |
| 11,815,948 B2 | 11/2023 | Song et al. |
| 2013/0058063 A1 | 3/2013 | OBrien |
| 2014/0211399 A1 | 7/2014 | O'Brien |
| 2020/0264660 A1 | 8/2020 | Song et al. |
| 2021/0099557 A1 | 4/2021 | Cha et al. |
| 2021/0218835 A1* | 7/2021 | Song .................... G06F 1/1652 |
| 2022/0124188 A1 | 4/2022 | Song et al. |
| 2023/0161380 A1* | 5/2023 | Lee ....................... G06F 1/1624 |
| | | 361/679.01 |
| 2023/0244279 A1 | 8/2023 | Kim et al. |

FOREIGN PATENT DOCUMENTS

| | | |
|---|---|---|
| CN | 113114810 A | 7/2021 |
| JP | 2011034346 A | 2/2011 |
| KR | 1020040103037 A | 12/2004 |
| KR | 20110102076 A | 9/2011 |
| KR | 20190062855 A | 6/2019 |
| KR | 20210028417 A | 3/2021 |
| KR | 20210031348 A | 3/2021 |
| KR | 20210037429 A | 4/2021 |
| WO | 2021-112291 A1 | 6/2021 |
| WO | WO-2021185096 A1 * | 9/2021 ............... G06F 1/16 |

OTHER PUBLICATIONS

Extended European Search Report for European Patent Application No. 22925079.0 (Jan. 28, 2025).

* cited by examiner

SEPARATION DUE
TO BUCKLING OF DISPLAY

DISPLAY SUPPORT STRUCTURE AND ROLLABLE ELECTRONIC DEVICE HAVING THE SAME

CROSS-REFERENCE TO RELATED APPLICATIONS

This application is a continuation application of International Application No. PCT/KR2022/014944 designating the United States, filed on Oct. 5, 2022, in the Korean Intellectual Property Receiving Office and claiming priority to Korean Patent Application No. 10-2022-0014150, filed on Feb. 3, 2022, and Korean Patent Application No. 10-2022-0039498, filed on Mar. 30, 2022, in the Korean Intellectual Property Office, the disclosures of which are incorporated by reference herein in their entireties.

TECHNICAL FIELD

Various embodiments disclosed in the disclosure relate to a rollable electronic device.

BACKGROUND ART

A size of a portable electronic device may be restricted for portability. Accordingly, the portable electronic device includes a display screen, of not more than a specific size. However, viewing various content such as videos, by using portable electronic devices has increased. Furthermore, watching various contents on a plurality of screens has increased. Accordingly, a measure for expanding a size of a display has been studied.

As a measure for expanding a size of a display screen, a foldable electronic device, a display screen of which may be folded, has been suggested. Furthermore, a rollable electronic device which provides a display area while a display screen is rolled and unrolled according to a situation, has been suggested. In the rollable electronic device, an operation of closing or retracting the display screen that is rolled, and an operation of opening or expanding the display screen while being un-rolled, may be performed.

DISCLOSURE

Technical Problem

Since a specific pressure is applied to the display (or display screen) of an electronic device, in an operation of closing and opening the display, the operation of opening or closing the display may not be smooth, and the display may be deformed or damaged.

Various embodiments of the disclosure provide a rollable electronic device that supports a rollable motion, by which deformation of or damage to a display may be restrained through a stable sliding operation of the display in an operation of closing or opening the above-described rollable electronic device.

Various embodiments of the disclosure also provide a rollable electronic device that supports a rollable motion, by which an efficiency spatial structure may be provided while a stable sliding operation is performed in a process of closing or opening the rollable electronic device.

In addition, the purposes and effects of the technology will be described through various embodiments, which will be described hereinafter.

Technical Solution

According to an aspect of the disclosure, a rollable electronic device includes a display structure including a fixed exposure area exposed fixedly, and an expandable exposure area extending from the fixed exposure area and exposed in correspondence to an opening operation of the rollable electronic device, a first housing that supports the fixed exposure area of the display structure, a second housing that supports at least a portion of the expandable exposure area when the at least a portion of the expandable exposure area extending from the fixed exposure area of the display structure is exposed, a sliding driving part disposed in the first housing and that controls opening or closing of the display structure, and a tension transmitting member, a first end of which is connected to one side of the display structure, and a second end of which is connected to one side of the first housing, and the sliding driving part closes the expandable exposure area by performing an operation of winding the tension transmitting member connected to the display structure in a first rotational direction, or opens the expandable exposure area by performing an operation of winding the tension transmitting member, at least a portion of which held on the second housing, in a second rotational direction.

According to an aspect of the disclosure, a rollable electronic device includes a display structure including a fixed exposure area exposed fixedly, and an expandable exposure area extending from the fixed exposure area and exposed in correspondence to an opening operation of the rollable electronic device, a first housing that supports the fixed exposure area of the display structure, a second housing that supports at least a portion of an expandable exposure area of the display structure, a sliding driving part disposed in the first housing and that controls opening or closing of the expandable exposure area of the display structure, a first tension transmitting member connected to one side of the display structure and one side of the sliding driving part, and a second tension transmitting member, one side of which is fixed to the first housing and an opposite side of which is connected to the sliding driving part after a portion of the second housing is held.

According to an aspect of the disclosure, a rollable electronic device includes a display structure, a first housing that supports the display structure, a second housing disposed to be slid with respect to the first housing, a sliding driving part that controls opening or closing of the display structure by controlling sliding of the second housing, and a tension transmitting member, one end of which is connected to one side of the display structure, an opposite end of which is fixed to one side of the first housing, and of which at least a portion between the one end and the opposite end is held on one side of the second housing, the sliding driving part includes a drum including at least one boss coupled to at least one hole formed in the tension transmitting member, and a motor that supports rotation of the drum, and the motor is rotated in a clockwise direction to contract a display area of the display structure, and is rotated in a counterclockwise direction to open the display area of the display structure.

According to an aspect of the disclosure, a rollable electronic device includes a display structure including a display area exposed to outside the rollable electronic device, a first housing connected to the display structure, a second housing connected to the first housing and slidable with respect to both the first housing and the display area of the display structure, along a plane, and the display area of the display structure being slidable along a thickness direction of the second housing. The second housing which is slid along the plane in a first direction away from the first housing, slides the second housing along the display area in the first direction together with sliding the display area along the thickness direction of the second housing, to expand the display area which is exposed to outside the rollable electronic device, and the display structure which is slid in a direction parallel to the plane and in a second direction toward the first housing, slides the display area along the thickness of the second housing together with sliding the second housing in the second direction, to contract the display area which is exposed to outside the rollable electronic device.

According to an aspect of the disclosure, a rollable electronic device includes a display structure including a display area exposed to outside the rollable electronic device, a first housing connected to the display structure by a tensioning member which controls tension applied to the display structure along a plane, in an opening operation which increases the display area and a closing operation which decrease the display area, a second housing connected to the first housing by the tensioning member, the second housing being slidable with respect to both the first housing and the display structure, in a direction parallel to the plane. Within both the opening operation and the closing operation, the tensioning member provides a direct tension to the display structure, together with an indirect tension to the display structure via the second housing, in the direction along the plane, in the opening operation, the tensioning member slides the second housing away from the first housing and along the display structure to provide the indirect tension to the display structure, together with the tensioning member providing the direct tension to the display structure, and in the closing operation, the tensioning member slides the second housing toward the first housing and along the display structure to provide the indirect tension to the display structure, together with the tensioning member providing the direct tension to the display structure.

Advantageous Effects

Various embodiments of the disclosure may alleviate a phenomenon, in which the display structure having the plurality of layers is separated, by providing the structure that may support the bottom surface of the display structure even during an operation of opening and closing the display area.

According to various embodiments of the disclosure, deflection or distortion, biasing in a specific direction, or distortion of a specific portion of the display structure may be alleviated since the center of weight of the display structure is utilized in an operation of closing the display area.

According to various embodiments of the disclosure, an operation of opening or closing the display area may be smoothly performed even though a rigidity (or stiffness) of the display structure is increased at an exterior temperature of not more than a specific value.

According to various embodiments of the disclosure, a stable sliding operation may be performed while the display structure is neither wrinkled nor distorted, by using one kind of external pressure, for example, only a tensile force during an operation of opening or closing the display area.

In addition, the disclosure may provide various effects that are directly or indirectly recognized.

Figure 1:
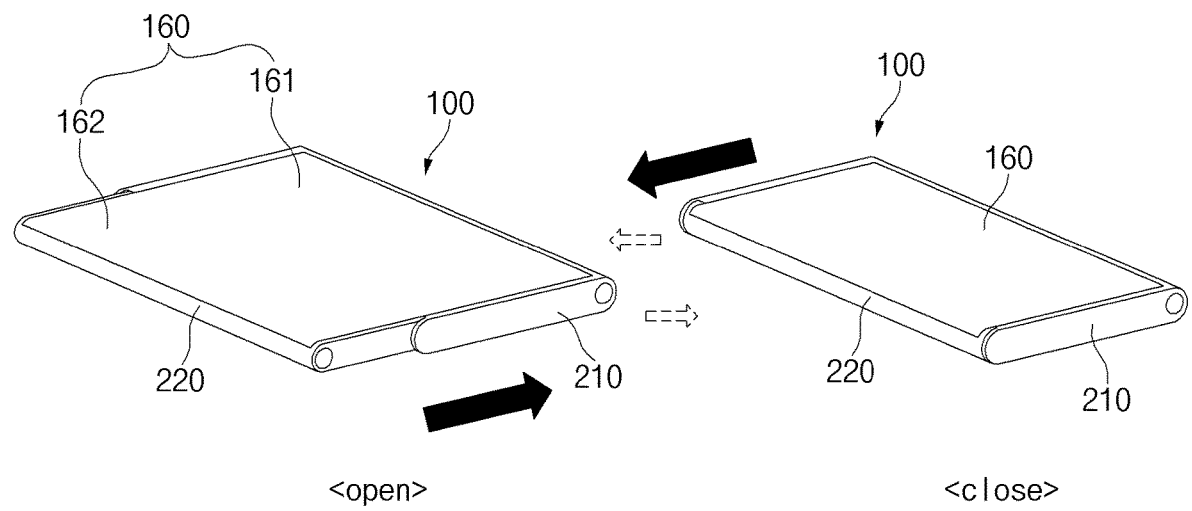
FIG. 1 includes views illustrating an example of an external appearance of a rollable electronic device according to an embodiment.

With regard to description of drawings, the same or similar components may be marked by the same or similar reference numerals. As used herein, a reference number may indicate a singular element or a plurality of the element. For example, a reference number labeling a singular form of an element within the drawing figures may be used to reference a plurality of the singular element within the text of specification.

MODE FOR INVENTION

Hereinafter, various embodiments of the disclosure will be described with reference to the accompanying drawings. Accordingly, those of ordinary skill in the art will recognize that modification, equivalent, and/or alternative on the various embodiments described herein can be variously made without departing from the scope and spirit of the disclosure. Like reference numerals refer to like elements throughout.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 2A:
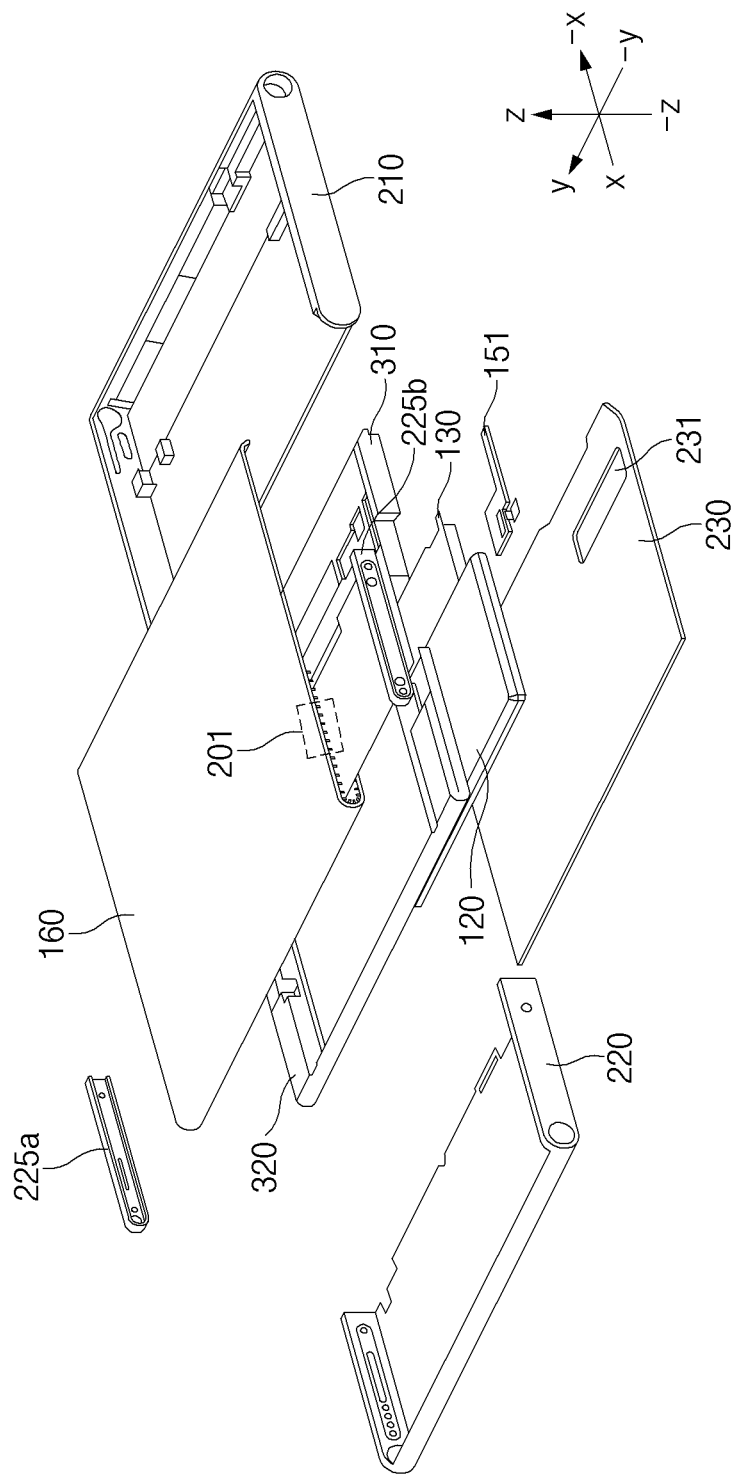
FIG. 2A is an exploded perspective view of a rollable electronic device according to an embodiment.
Figure 2B:
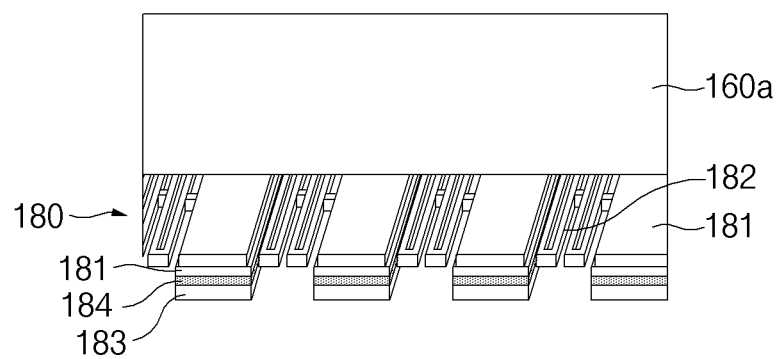
FIG. 2B is an enlarged perspective view of a portion 201 of FIG. 2A.
Figure 3A:
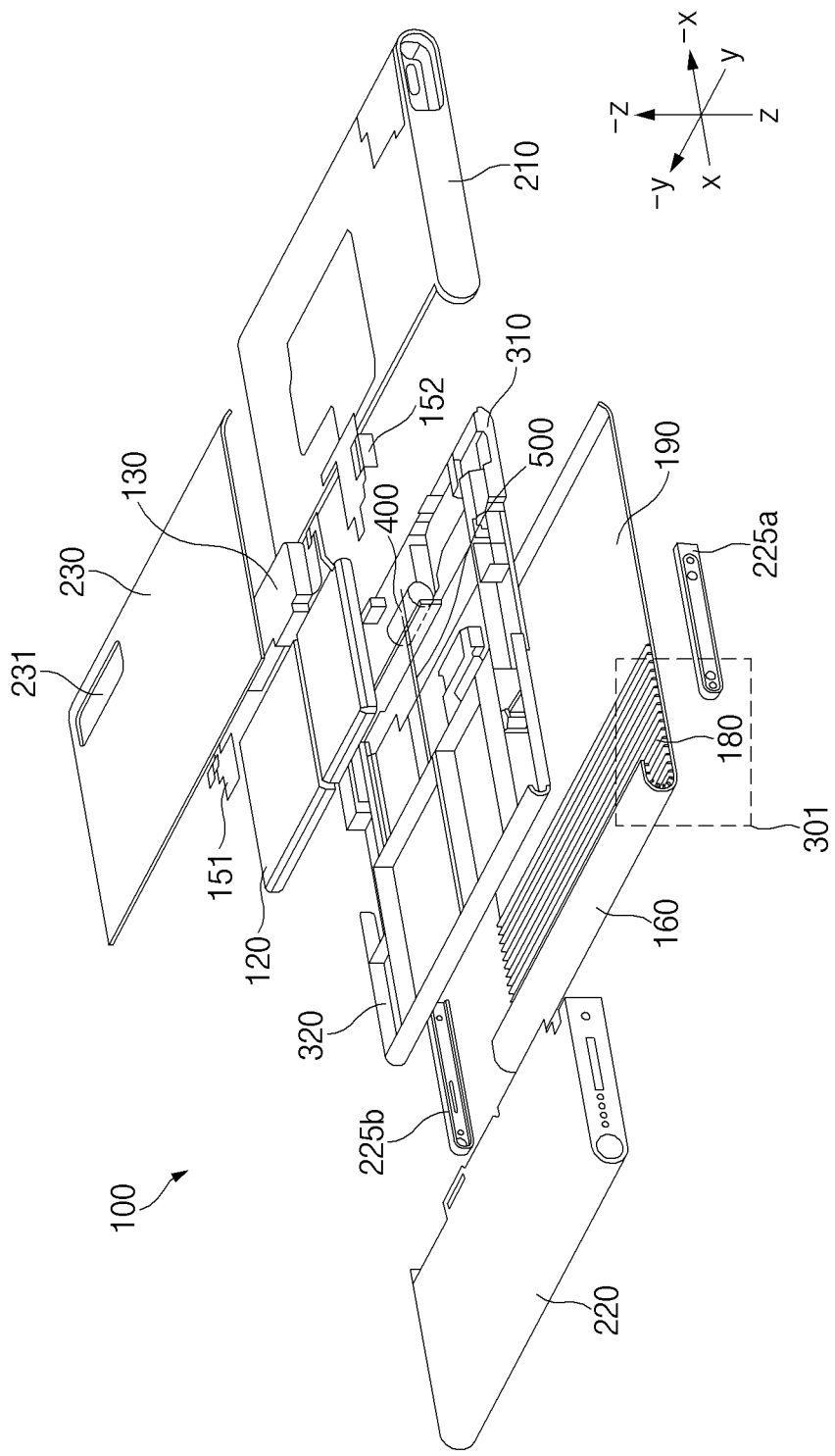
FIG. 3A is an exploded perspective view of a rollable electronic device according to an embodiment.
Figure 3B:
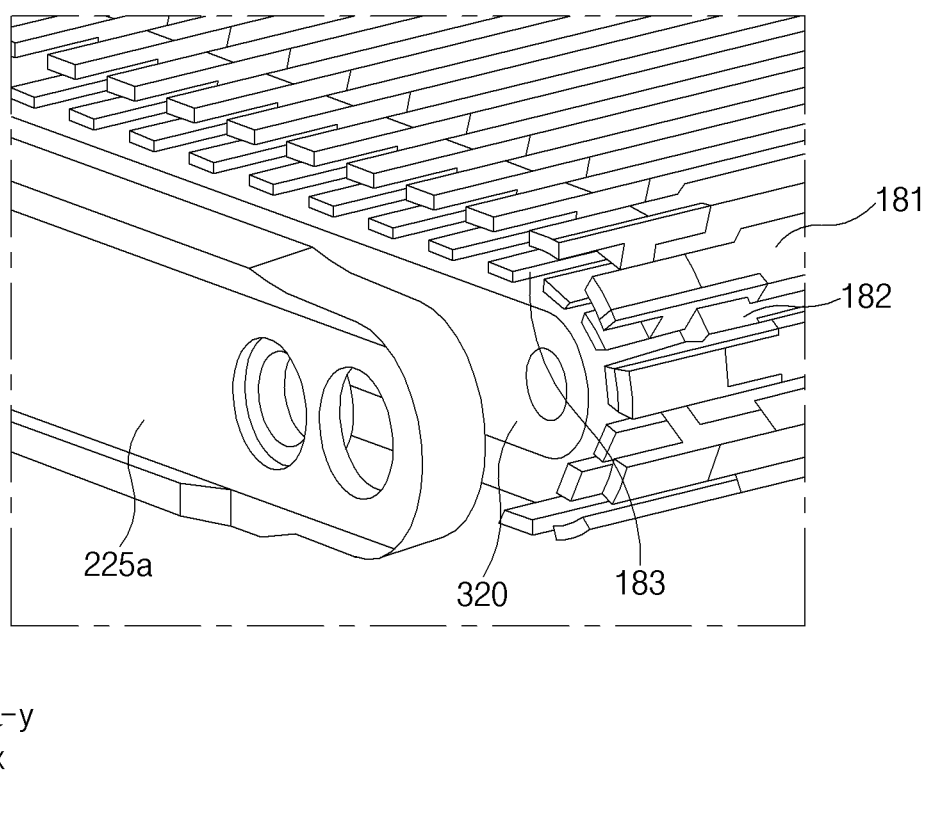
FIG. 3B is an enlarged perspective view of portion 301 of FIG. 3A.
Figure 3C:
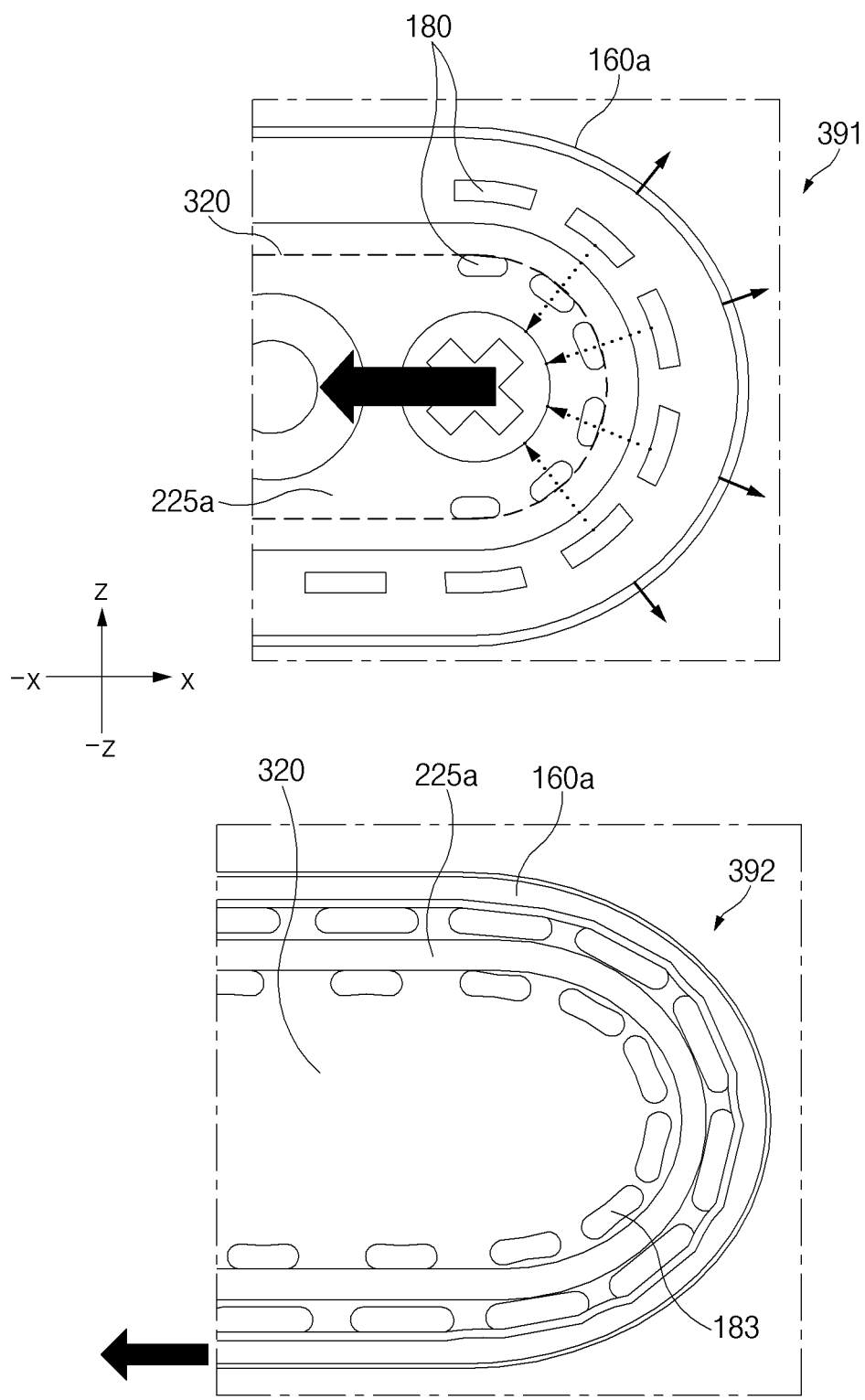
FIG. 3C includes cross-sectional views illustrating deformation of a display according to movement of a rollable electronic device.

FIG. 1 is a view illustrating an example of an external appearance of a rollable electronic device according to an embodiment. FIG. 2A is an exploded perspective view of a rollable electronic device according to an embodiment, and FIG. 2B is an enlarged perspective view of a portion 201. FIG. 3A is a view illustrating an exploded perspective view of the rollable electronic device according to an embodiment, in a second direction. FIG. 3B is a view illustrating an example of portion 301 of FIG. 3A. FIG. 3C is a view illustrating deformation of a display according to movement of the rollable electronic device.

Referring to FIGS. 1 to 3B, a rollable electronic device 100 according to an embodiment may include a display structure 160, a first housing 310 (or a main housing), a second housing 320 (or a sliding housing), a housing cover 210, a slide cover 220 (or a first cover), rail parts 225a and 225b, a back cover 230 (or a second cover), at least one battery 120, a camera module 130, and a sliding driving part 400 as a sliding driver (or a driving structure or a driving module). According to the rollable electronic device 100 having the above-described configuration, an exposure area (or a screen display area or a display area) of the display structure 160 is opened while the second housing 320 is slid in one direction with respect to the first housing 310, and the exposure area (or the screen display area or the display area) of the display structure 160 is contracted while the display structure 160 is pulled in a direction that is opposite to the one direction. In this process, the rollable electronic device 100 may adjust an exposure size of a display area by moving the second housing 320 or moving the display structure 160 by using a tension.

The display structure 160 may include a fixed exposure area supported by the first housing 310, and an expandable exposure area, an exposure area (or a screen display area, a display area, or an expandable area) of which may be expanded or contracted according to sliding of the second housing 320. In this process, at least a portion of the expandable exposure area may be supported by the second housing 320. As another example, the display structure 160 may include a screen display area of the display, which is opened according to sliding of the second housing 320 and is contracted by a tension that directly pulls the display structure 160. For example, the display structure 160 may include a fixed exposure area 161 (or a fixed area, in which an exposed area is fixed), in which a size of the screen display area is not changed, and an expandable exposure area 162 (or a changeable area, in which a disposition form thereof is changed), in which the screen display area is opened according to sliding of the second housing 320. The display structure 160 may include a display 160*a*, and a support structure 180 disposed below the display 160*a*. Referring to FIG. 1, in a contraction state (e.g., closed) of the display 160*a*, at portion of the expandable exposure area 162 may be received in an interior of the first housing 310 (or seated on the first housing), and in an expansion state (e.g., an open state) of the display 160*a*, at least a portion of the expandable exposure area 162 may be exposed to an outside of the first housing 310. The display structure 160 may include a rear layer 190 that supports the fixed exposure area 161, and the support structure 180 that supports the expandable exposure area 162. A portion of the rear layer 190 and a portion of the support structure 180 may be disposed to be adjacent to each other, or may be connected to each other.

The display 160*a* may include a set (e.g., a display panel) of one or more pixels that express an image based on electric power supplied from the battery 120. For example, the display 160*a* may include a display layer (e.g., a display panel or an OLED layer) that expresses a screen. According to an embodiment, the display 160*a* may include at least one rear layer 190 of the display layer that displays the screen, which supports the fixed exposure area 161 (or include the rear layer 190 disposed under the display panel). The at least one rear layer 190, for example, may include at least one of an embossing layer, at least one metallic layer, or a cushion layer disposed under the display layer.

The support structure 180 may be formed such that at least a portion of the display 160*a* is curved, while supporting at least a partial area (e.g., the expandable exposure area 162) of the display 160*a*. At least a partial area of the support structure 180 disposed under the expandable exposure area 162 may include a lattice pattern. At least a partial area of a portion of the support structure 180, which is disposed to be adjacent to the fixed exposure area 161, may have a panel or flat frame structure having no separate lattice pattern. The support structure 180 disposed under the expandable exposure area 162 may include a plurality of lattice pattern areas 182 disposed under the display 160*a*, a plurality of lattice connecting areas 181 disposed between the plurality of lattice pattern areas 182, and a multi-bar 183 including a plurality of bars disposed under the lattice connecting areas 181 to support the lattice connecting areas 181, and an adhesive layer 184 that bonds the lattice connecting areas 181 and the multi-bar 183. As another example, the configurations (e.g., the plurality of lattice pattern areas 182, the plurality of lattice connecting areas 181, and the multi-bar 183) included in the support structure 180 may be integrally formed. In this case, the configuration of the adhesive layer 184 may be omitted. At least a portion of the support structure 180 may be formed of a metallic material.

At least a portion of the first housing 310 may be disposed in and fixed to the housing cover 210. At least a portion of the second housing 320 may be seated on a lower side (e.g., one surface that faces the −z axis direction) of the first housing 310. At least a portion of the first housing 310 may be formed of a metallic material. According to an embodiment, a motor structure related to movement of the second housing 320 and the display structure 160 may be seated on and fixed to the first housing 310. As an example, at least one battery 120 and at least one main printed circuit boards 151 and 152 may be disposed on one side of the first housing 310. At least one electronic element for driving the display 160*a* may be disposed in the main printed circuit boards 151 and 152. Furthermore, at least one electronic element for supporting communication functions of the rollable electronic device 100 and/or at least one electronic element that supports a sensor function may be disposed in the main printed circuit boards 151 and 152.

At least a portion of the second housing 320 may be disposed on a lower side (e.g., a surface that faces the −z axis direction) of the first housing 310, and the at least a portion may be covered by the slide cover 220. The second housing 320 may be slid in the x axis or −x axis direction in correspondence to manipulation of the motor structure disposed in the first housing 310. As an example, the second housing 320 may perform an operation of exposing the expandable exposure area 162 (or an operation of opening the display area) while pushing one side of the display structure 160 in the x axis direction (while releasing a rolled part of the display structure 160 in the x axis direction or while exposing a received portion of the display structure 160 received to face the −z axis direction such that the received portion faces the z axis direction) while being slid in the x axis direction. While the second housing 320 is slid in the −x axis direction, at least a portion of the expandable exposure area 162 of the display structure 160 may be contracted (or be operated such that the display area is contracted). In this process, the second housing 320 may contact at least a portion (e.g., the multi-bar 183) of the display structure 160 to support a curved portion of the display 160*a* such that the curved portion is neither distorted nor deflected, while driving the display structure 160 in the x axis direction.

The first housing 310, the slide cover 220, on which the second housing 320 is seated, and at least some of the rail parts 225*a* and 225*b* disposed on one side of the slide cover 220 to surround a side surface of the display structure 160 may be disposed in the housing cover 210. At least one side (e.g., the x axis direction) of the housing cover 210 may be opened such that the slide cover 220 is extracted and inserted, and side walls thereof may be formed in the remaining directions (e.g., the y, −y, and −x axis directions). The first housing 310 and at least a portion of the slide cover 220 may be disposed inside the side walls. At least a portion of the housing cover 210 may be formed of a metallic material, such as the first housing 310 or the second housing 320, but the housing cover 210 of the disclosure is not limited to a specific material. For example, at least a portion of the housing cover 210 may be formed of a material, such as plastic, a polymer, and/or ceramic. A hole, through which at least one camera included in the camera module 130 may be exposed to an outside, may be formed on one side of the housing cover 210.

At least a portion of the second housing 320 may be disposed in the slide cover 220. The rail parts 225*a* and 225*b* disposed on side surfaces of the multi-bar 183 of the display structure 160 to guide a sliding operation of the multi-bar 183 may be disposed in the slide cover 220. The slide cover 220 may include a bottom part (or an upper part) (a part disposed in the −z axis direction) disposed to cover one side of the second housing 320, and the side walls that extend from peripheries of the bottom part in the z axis direction. The −x axis direction of the slide cover 220 may be opened to be coupled to the second housing 320, and at least a portion of the slide cover 220 in the x axis direction, which faces a portion of the multi-bars 183, which defines a curved surface, may be formed to have a specific curvature. The above-described slide cover 220 may be formed of the same material as that of the housing cover 210, but the slide cover 220 of the disclosure is not limited to the material. That is, at least a portion of the slide cover 220 may be formed of a metallic or nonmetallic material.

The rail parts 225a and 225b may be disposed to surround the side surfaces of the support structure 180 in at least a partial area of the display structure 160, in which the support structure 180 is formed. The rail parts 225a and 225b, for example, may include the first rail part 225a disposed in the −y axis direction, and disposed to face a periphery of the support structure 180 in they axis direction, and a second rail part 225b disposed in they axis direction, and disposed to face a periphery of the support structure 180 in the −y axis direction. Rail grooves, in which ends of the multi-bars 183 of the support structure 180 may be seated, may be formed on an inner side of the rail parts 225a and 225b. The rail parts 225a and 225b may function to support and guide the multi-bar 183 while the display structure 160 is opened and closed. The rail parts 225a and 225b may be disposed in side walls of the slide cover 220 in the y axis direction and the −y axis direction.

Referring to FIG. 3B, at least a periphery of the second housing 320 in the y axis direction may be disposed on an inner side (an inner side of the first rail part 225a observed when viewed from the −y axis in the y axis direction) of the first rail part 225a. At least a portion of a y axis periphery of the multi-bar 183 may be disposed on an inner side of the first rail part 225a. A disposition state of at least a portion of the multi-bar 183, which is disposed on an inside of the first rail part 225a, may be changed in correspondence to movement of the first rail part 225a. For example, one surface of the multi-bar 183, which is disposed to face the z axis direction, may be disposed to face the −z axis direction in correspondence to movement of the first rail part 225a. Furthermore, one surface of the multi-bar 183, which is disposed to face the −z axis direction, may be disposed to face the z axis direction in correspondence to movement of the first rail part 225a. Meanwhile, although it has been described in the above description that the multi-bar 183 is moved or displaced according to movement of the first rail part 225a, the multi-bar 183 may be moved or displaced in correspondence to movement of the second rail part 225b. At least a portion of a −y axis periphery of the multi-bar 183 or a portion of a −y axis periphery of the second housing 320 may be disposed on an inner side of the second rail part 225b, and at least a portion of the multi-bar 183 may be moved in the x axis direction or the −x axis direction in correspondence to movement of the first rail part 225a.

The back cover 230 may be disposed in a rearward direction (e.g., the −z axis direction) of the housing cover 210. The back cover 230 may be bonded to a rear surface of the housing cover 210 and may function to protect the housing cover 210. At least a portion of the back cover 230 may be formed of a material for increasing a grip feeling of a user while primarily decreasing damages to the housing cover 210. For example, at least a portion of the back cover 230 may be formed of a metallic material or may be formed of tempered glass, ceramic, and/or a polymer. To cover even at least a portion of a side wall of the housing cover 210 in the −x axis direction, the back cover 230 may have the same shape (e.g., a curved shape) as that of a side wall of the housing cover 210 in the −x axis direction, and may have a shape corresponding to a flat area in the −z axis direction. At least one camera hole 231, through which the camera included in the rollable electronic device 100 may be exposed, may be formed on one side of the back cover 230. The camera hole 231 may be aligned with a hole formed in the housing cover 210 in an upward/downward direction (the z axis or −z axis direction).

The battery 120 may supply electric power for managing the rollable electronic device 100. As an example, the battery 120 may include one body or a plurality of bodies. The battery 120 may have a shape corresponding to at least a partial shape of the first housing 310 or the second housing 320. The battery 120 may be disposed in the first housing 310, or may be disposed in the second housing 320. Alternatively, a portion of the battery 120 may be disposed in the first housing 310, and the remaining portions of the battery 120 may be disposed in the second housing 320.

The camera module 130 may support a camera function of the rollable electronic device 100. The camera module 130 may include at least one camera and a driving module that is necessary for driving the at least one camera, and the camera module 130 may be fixed to one side of the first housing 310. At least a portion of the camera module 130 may be disposed to be exposed to an outside through the hole formed in the housing cover 210 and the camera hole 231 formed in the back cover 230.

The sliding driving part 400 may be disposed on one side of the first housing 310, and may push the second housing 320 in the x axis direction or pull the second housing 320 in the −x axis direction by using tension transmitting members 531 and 532 (or a tension member or a tension transmitting structure) (e.g., a wire, a rope, a belt, or a chain, hereinafter, will be referred to as the tension transmitting member) that may transmit a tension. For example, the sliding driving part 400 may be electrically connected to a processor disposed in the printed circuit boards 151 and 152, and may move the second housing 320 in the x axis direction or in the −x axis direction by winding or unwinding the at least one tension transmitting members 531 and 532 in correspondence to control of the processor.

Referring to FIG. 3C, in relation to closing of the display area of the display 160a, when the second housing 320 and the first rail part 225a (or the second rail part 225b) is moved in the −x axis direction as in operation 391, at least a portion of a direction of a force applied to a portion of the multi-bar 183 inserted into the first rail part 225a (or the second rail part 225b) may be a movement direction (or a centripetal direction with respect to one point of a −x axis periphery of the second housing 320) of the first rail part 225a. In this operation, at least a portion of a direction of a force (a force that tends to straighten the curved display, and a repulsive force against bending) generated in the display 160a located at an x axis periphery of the second housing 320 may be the x axis direction (or a centrifugal direction with respect to one point of the x axis periphery of the second housing 320). In this way, since the direction of the force (e.g., the centripetal force applied to the display 160a with respect to a center of the x axis periphery of the second housing 320) and the direction (e.g., the centrifugal direction with respect to a center of the x axis periphery of the second housing 320) generated in the display 160a are different, a coming-over phenomenon (or a separation phenomenon, indicated by the double-headed arrows in the top view of FIG. 3C) between the multi-bar 183 and the display 160a may occur at the x axis periphery, at which the display 160a defines the curved surface or at least a portion of the display 160a may be distorted.

As in operation 392, when an operation of contracting the display area of the rollable electronic device 100 is performed by pulling the display structure 160 in the −x axis direction by the at least one tension transmitting members 531 and 532, to which one point of the display structure 160 (e.g., the support structure 180) is connected, a direct force is not applied to the multi-bar 183 of the support structure 180 but a force is directly applied to the display 160a, and thus coming-over, bucking, or distortion between the multi-bar 183 of the support structure 180 and the display 160a may be reduced. That is, in operation 391, deformation of the display 160a may be reduced by eliminating a force that pulls the multi-bar 183 of the display 160a in the centripetal force and directly pulling one end (e.g., a −x axis periphery) of the display 160a with respect to the second housing 320.

As described above, the rollable electronic device 100 according to an embodiment may improve separation or distortion of the display structure 160 by providing a force that directly pulls the display structure 160 in a process of contracting the display area by winding the tension transmitting members 531 and 532 in a specific direction (e.g., the −x axis direction).

Figure 4A:
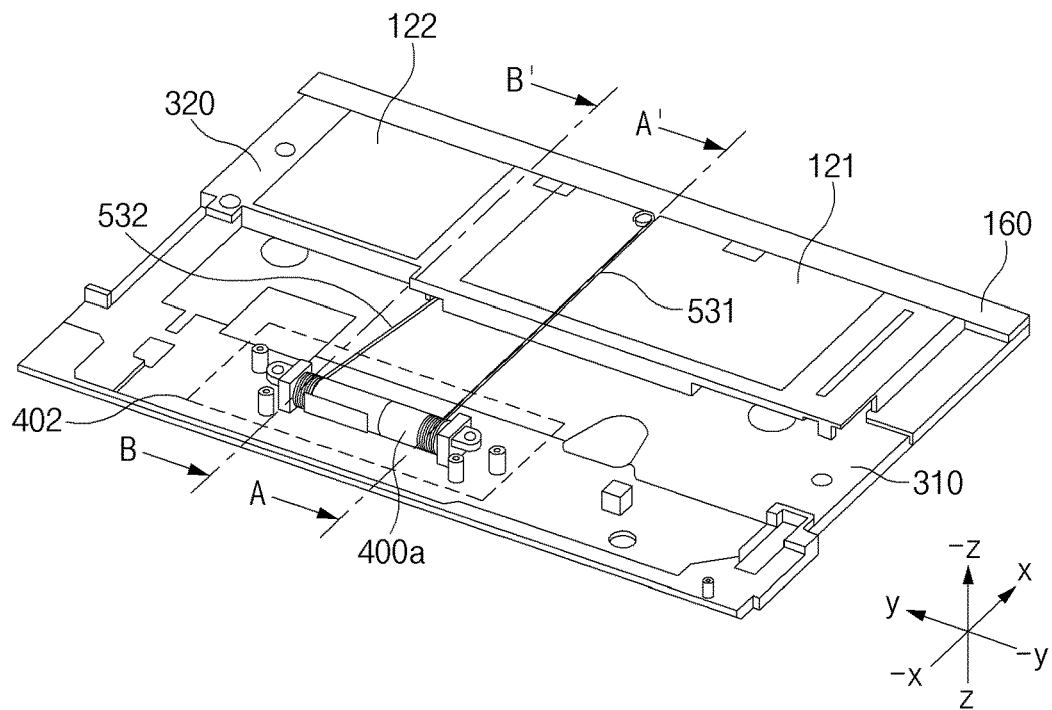
FIG. 4A is a perspective view illustrating an example of a rollable electronic device including a first type sliding driving part according to an embodiment.
Figure 4B:
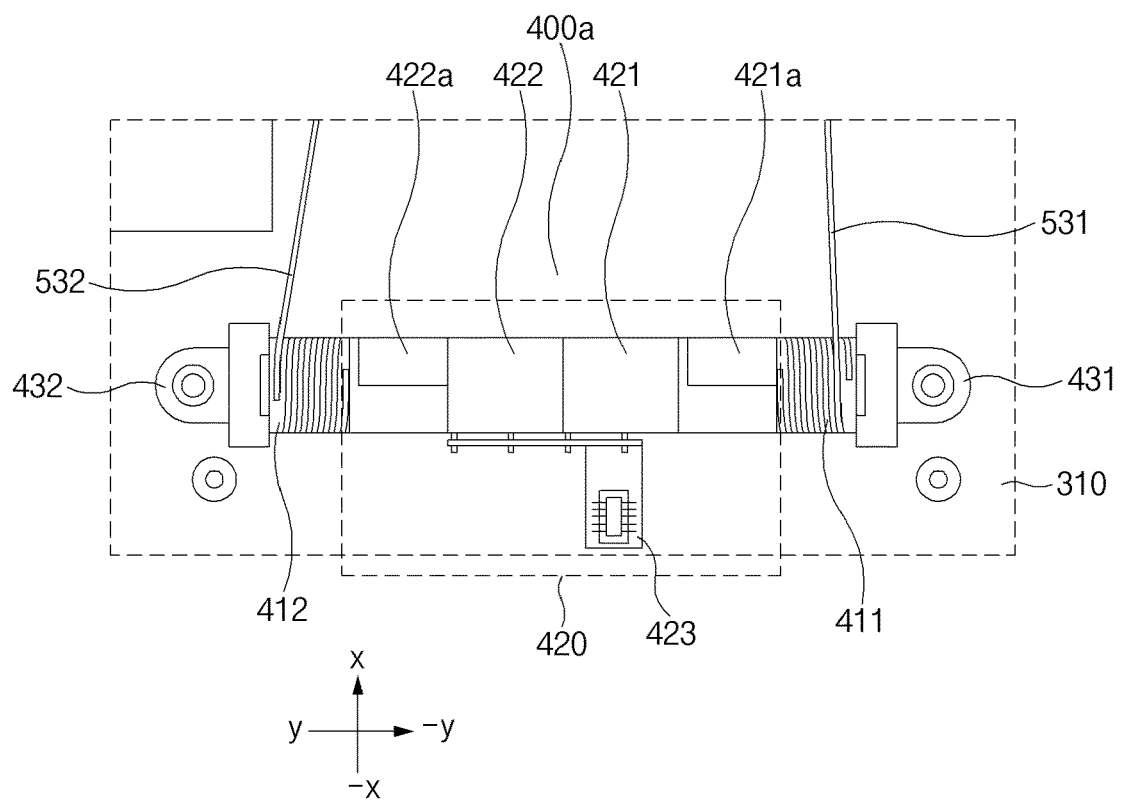
FIG. 4B is an enlarged plan view of portion 402 of FIG. 4A.
Figure 5A:
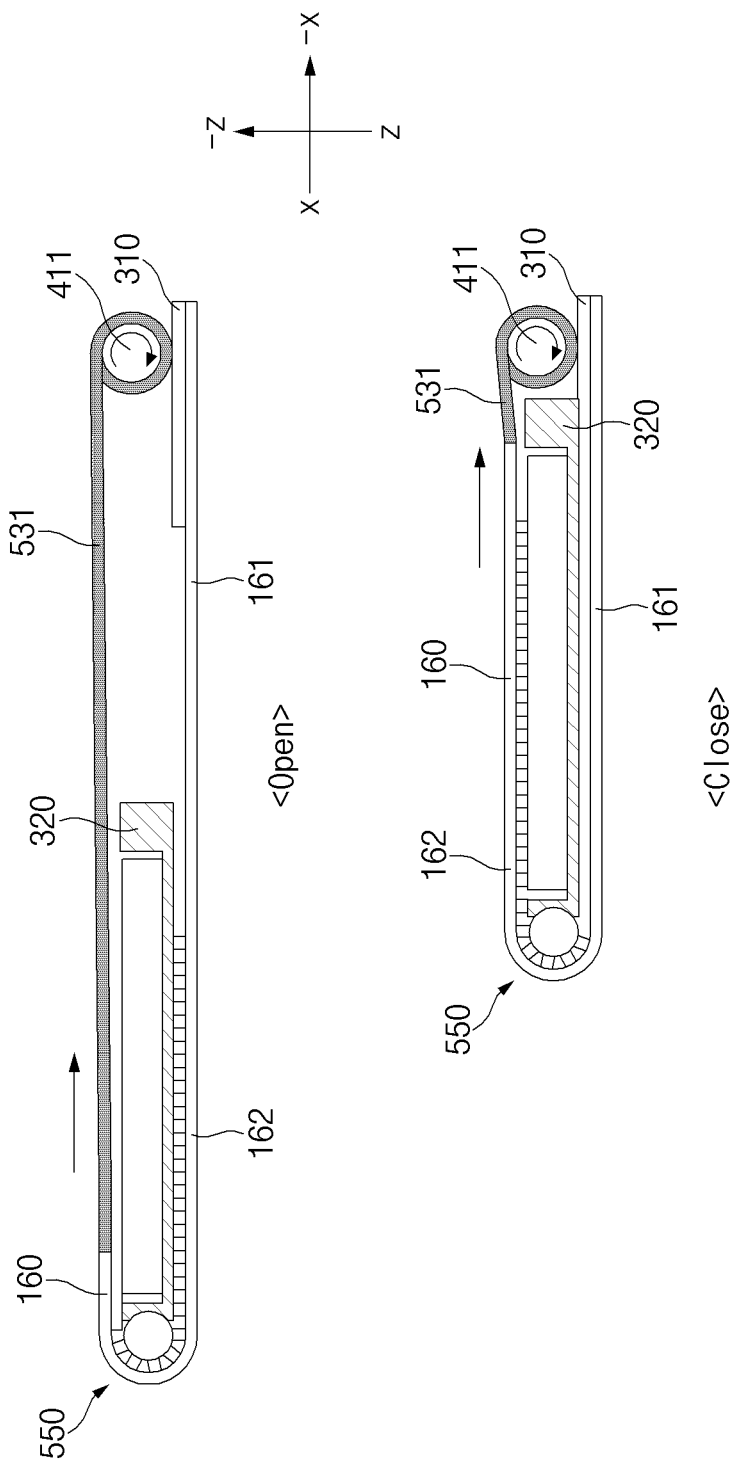
FIG. 5A is a cross-sectional view illustrating an example of a change in a cross-section along line A-A' of FIG. 4A.
Figure 5B:
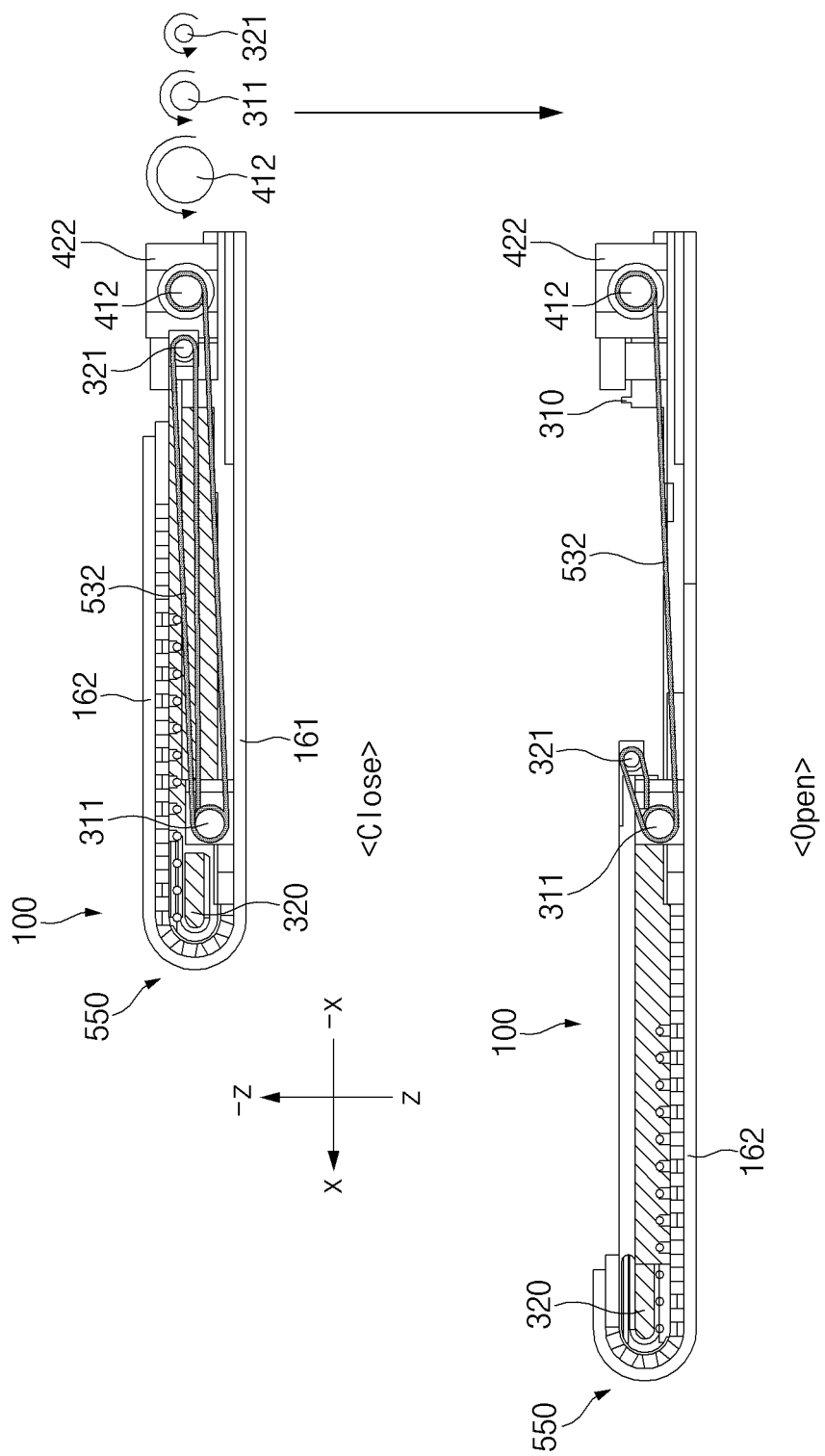
FIG. 5B is a cross-sectional view illustrating an example of a change in a cross-section along line B-B' of FIG. 4A.
Figure 5C:
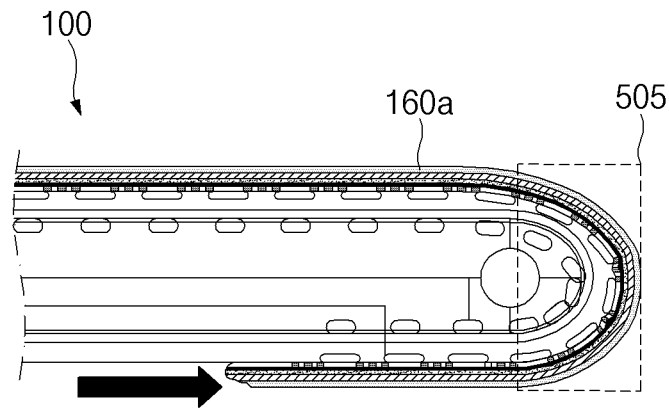
FIG. 5C is a cross-sectional view illustrating an example of deformation according to a movement form of a display structure.
Figure 5D:
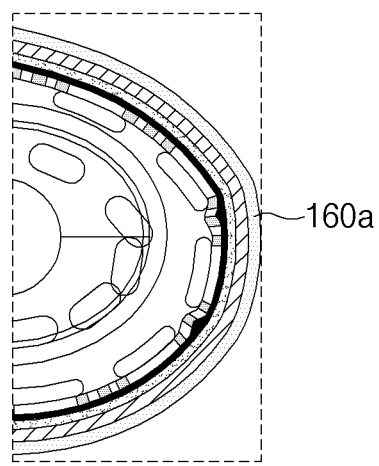
FIG. 5D is an enlarged cross-sectional view of portion 505 in FIG. 5C.

FIG. 4A is a perspective view illustrating an example of a rollable electronic device including a first type sliding driving part according to an embodiment, and FIG. 4B is an enlarged plan view of portion 402 of FIG. 4A. FIG. 5A is a view illustrating an example of a change in a cross-section along line A-A' of FIG. 4A. FIG. 5B is a view illustrating an example of a change in a cross-section along line B-B' of FIG. 4A. FIG. 5C is a cross-sectional view illustrating an example of deformation according to a movement form of a display structure, and FIG. 5D is an enlarged cross-sectional view of portion 505 in FIG. 5C.

Referring to FIGS. 1 to 5B, the rollable electronic device 100 according to an embodiment may include the first housing 310, the second housing 320, the display structure 160, the first tension transmitting member 531, the second tension transmitting member 532, and a first type sliding driving part 400a.

The first housing 310 may have the same material and shape as those of the first housing 310 described with reference to FIGS. 1 to 3A. For example, at least a portion of the second housing 320 may be disposed or seated on one side (at least a portion of a surface that faces the z axis from the −z axis) of the first housing 310. Furthermore, at least a portion of the display structure 160 may be disposed or seated on an opposite side (at least a portion of a surface that faces the −z axis from the z axis) of the first housing 310. According to an embodiment, the opposite side of the first housing 310 may support the fixed exposure area 161 of the display structure 160.

The second housing 320 may have the same material, shape, and function as those of the second housing 320 described with reference to FIGS. 1 to 3A. For example, at least a portion of the second housing 320 may be disposed on one side (e.g., at least a portion of a surface that faces the z axis from the −z axis), and the second housing 320 may be slid along one surface of the first housing 310 by tensions of the first type sliding driving part 400a, the first tension transmitting member 531, and the second tension transmitting member 532. A portion of the second tension transmitting member 532 that is used when the display area of the display structure 160 is opened, for example, may be held at one point of the second housing 320. According to an embodiment, batteries 121 and 122 may be disposed or seated on one side of the second housing 320. Sizes of the batteries 121 and 122 disposed in the second housing 320 may be different. For example, the size of the first battery 121 may be formed to be larger than the size of the second battery 122. In correspondence, the second housing 320 may include a first area, in which the first battery 121 is disposed, and a second area, in which the second battery 122 is disposed, and the first area may be formed to be larger than the second area.

The display structure 160 may include the same structure as that of the display structure 160 in FIGS. 1 to 3A described above. For example, the display structure 160 may include the fixed exposure area 161 and the expandable exposure area 162. The display structure 160 may include a plurality of multi-bars 183. The multi-bar 183 disposed to be adjacent to one end (e.g., a periphery of the second housing 320) of the second housing 320 or at least a portion of an area of the display 160a, which is supported by the multi-bar 183, may define a curved part 550. The display structure 160 may be connected to the first tension transmitting member 531, and is moveable together therewith along an opening and closing direction. In this regard, the display structure 160 may include a fixed part (or a fixed portion), to which the first tension transmitting member 531 may be connected, and the fixed part may be formed as the above-described at least a portion of the multi-bar 183 is deformed or as a separate structure extends from the multi-bar 183.

The first tension transmitting member 531 may be disposed to connect one of drums 411 and 412 of the first type sliding driving part 400a and one side (e.g., an x axis peripheral portion of the display structure 160) of the display structure 160. As an example, the first tension transmitting member 531 may be connected to an intermediate point (e.g., an intermediate point of they axis at the x axis peripheral portion of the display structure 160) in a lengthwise direction (e.g., they axis or −y axis direction) of the display structure 160. After one side (e.g., an x axis end of the first tension transmitting member 531) is fixed to the first drum 411 of the first type sliding driving part 400a, the first tension transmitting member 531 may be disposed to be wound on the first drum 411 or be unwound from the first drum 411 according to rotation of the first drum 411. According to various embodiments, an operation of winding or unwinding the first tension transmitting member 531 on or from the first drum 411 may be performed in the same direction as or an opposite direction to an operation of winding or unwinding the second tension transmitting member 532 on or from the second drum 412. For example, the first tension transmitting member 531 may be unwound from the first drum 411 while the second tension transmitting member 532 is wound, and the first tension transmitting member 531 may be wound on the first drum 411 while the second tension transmitting member 532 is unwound. Furthermore, the first tension transmitting member 531 may be wound on the first drum 411 while the second tension transmitting member 532 is wound, and the first tension transmitting member 531 may be unwound from the first drum 411 while the second tension transmitting member 532 is unwound. Although the first tension transmitting member 531 may be a single wire formed of at least one of fibers, nylon, a metallic wire, or a polymer material, or may be a wire or folded yarns formed of the at least one material or formed complexly, but the tension transmitting member of the disclosure is not limited to a specific material.

The second tension transmitting member 532 may be disposed to be spaced apart from a location, at which the first tension transmitting member 531. The second tension transmitting member 532 may be disposed to be wound on the other (e.g., the second drum 412) of the drums of the first type sliding driving part 400*a*, and may be fixed to the first housing 310 after a portion thereof is held on one side of the second housing 320. The second tension transmitting member 532 may be connected to one point within a specific distance from an intermediate point in an lengthwise direction (e.g., the y axis direction or the −y axis direction from the −x axis periphery of the second housing 320) of the second housing 320 or an intermediate point in an lengthwise direction (e.g., the y axis direction or the −y axis direction in an direction that is perpendicular to a direction, in which the second housing 320 is slid) of the second housing 320 while not overlapping a location, at which the first tension transmitting member 531 is disposed.

As an example, the second tension transmitting member 532 may be wound on the second drum 412 or be unwound from the second drum 412 according to rotation of the second drum 412 after being held on one side (e.g., an x axis end of the second tension transmitting member 532 or an end in an direction, in which the display area is opened) of the second drum 412 of the first type sliding driving part 400*a* and then being fixed to the first housing 310. The second tension transmitting member 532 may be unwounded from the second drum 412 while the first tension transmitting member 531 is wound, and may be wound on the second drum 412 while the first tension transmitting member 531 is unwound. Furthermore, the second tension transmitting member 532 may be unwound from the second drum 412 while the first tension transmitting member 531 is unwound from the second drum 412, and may be wound on the second drum 412 while the first tension transmitting member 531 is wound on the first drum 411. For example, the second tension transmitting member 532 may be connected to the first housing 310 after at least a portion thereof is disposed (or located or held) on the other of the drums of the first type sliding driving part 400*a* and held on a movable pulley 321 of the second housing 320. The second tension transmitting member 532 may be formed of a material that is the same as or similar to that of the first tension transmitting member 531.

The first type sliding driving part 400*a* may control opening and closing of the screen display area (or the display area or the exposure area) of the display structure 160, through control of states or operations of the first tension transmitting member 531 and the second tension transmitting member 532. The first type sliding driving part 400*a* may be fixed to the first housing 310, and may be electrically or functionally (or physically or operatively) connected to the printed circuit board disposed in the first housing 310 to be operated in correspondence to control of the processor disposed in the printed circuit board. The first type sliding driving part 400*a* may include a motor driving part 420 that generates power, the first drum 411 and the second drum 412 connected to the motor driving part 420, and a first fixing part 431 and a second fixing part 432 that fix the first housing 310 such that the first housing 310 does not deviate a specific location while allowing rotation of the first drum 411 and the second drum 412.

According to various embodiments, at least one of the first fixing part 431 and the second fixing part 432 may further include a bearing structure, and the bearing structure may be connected to shafts included in the drums 411 and 412. Based on this, a first sliding driving part 400*a* may alleviate loss of a driving force of the motor driving part 420 by reducing frictions with the shafts of the drums 411 and 412, and may alleviate jitters and joints that may occur in a process of driving the motor driving part 420 by minimizing gaps (e.g., gaps between the fixed parts 431 and 432 and the drums 411 and 412) between the structures.

The motor driving part 420 may include at least one motor (e.g., a first motor 421 and a second motor 422), at least reduction gear (e.g., a first reduction gear 421*a* and a second reduction gear 422*a*), and a driving circuit 423. The motor driving part 420 may drive (e.g., rotate) at least one drum (e.g., the first drum 411 and/and the second drum 412) by driving the at least one motor based on the electric power supplied from the battery 120. Here, the first reduction gear 421*a* and the second reduction gear 422*a* are adapted to adjust a speed of the motor, which is delivered to the drums 411 and 412, and may be omitted.

A plurality of first motors 421 and a plurality of second motors 422 may be disposed to reduce thicknesses and sizes of the motors while coping with outputs (or thrusts) for driving the first drum 411 and the second drum 412, as compared with a situation, in which one motor is used. When the plurality of motors are responsible for driving of the first drum 411 and the second drum 412, they may be manufactured in relatively small sizes as compared with a structure that uses one motor, and thus a thickness of the rollable electronic device 100 may be reduced. The first motor 421 and the second motor 422 may be operated simultaneously to generate and supply thrusts for rotating the first drum 411 and the second drum 412. According to various embodiments, the first motor 421 may be rotated by using the electric power supplied through the driving circuit 423 and may transmit the power due to the rotation to the first drum 411 via the first reduction gear 421*a*. The second motor 422 may be rotated by using the electric power supplied through the driving circuit 423 and may transmit the power due to the rotation to the second drum 412 via the second reduction gear 422*a*. Alternatively, the first motor 421 and the second motor 422 may generate a thrust for driving the first drum 411 and transmit the thrust to the first drum 411 via the first reduction gear 421*a* when the first drum 411 is driven, and may generate a thrust for driving the second drum 412 and transmit the thrust to the second drum 412 via the second reduction gear 422*a* when the second drum 412 is driven. According to various embodiments, operation directions of the first motor 421 and the second motor 422 may be opposite to each other. For example, while the first motor 421 generates power for clockwise rotation, the second motor 422 may generate the power for counterclockwise rotation. While the first motor 421 generates power for counterclockwise rotation, the second motor 422 may generate the power for clockwise rotation.

The first reduction gear 421*a* and the second reduction gear 422*a* reduce rotational speeds of the first motor 421 and the second motor 422, respectively, and function to deliver the rotational speeds to the first drum 411 and the second drum 412. In this regard, the first reduction gear 421*a* may be connected to a motor shaft of the first motor 421, and the second reduction gear 422*a* may be connected to a motor shaft of the second motor 422.

The driving circuit 423 may receive control signals and electric power that are necessary for driving the first motor 421 and the second motor 422 from the processor, and may deliver them to the first motor 421 and the second motor 422. At least a portion of the driving circuit 423 may include a flexible type printed circuit board or a rigid type printed circuit board, and may include control chips that generate control signals for driving the motors.

The first drum 411 may be disposed between the first reduction gear 421*a* and the first fixing part 431, and may be rotated in a first direction (e.g., a clockwise direction) and a second direction (e.g., a counterclockwise direction) by the power transmitted through the first reduction gear 421a. As an example, the first drum 411 may be rotated in an opposite direction (e.g., second rotational direction) to a rotational direction (e.g., first rotational direction) of the second drum 412.

The second drum 412 may be disposed between the second reduction gear 422a and the second fixing part 432, and may be rotated in one direction or an opposite direction to the one direction by the power transmitted through the second reduction gear 422a. As an example, the second drum 412 may be rotated in an opposite direction to that of the first drum 411. For example, when the second drum 412 may be rotated in the second direction (e.g., the counterclockwise direction) when the first drum 411 is rotated in the first direction (e.g., the clockwise direction), and may be rotated in the first direction (e.g., the clockwise direction) when the first drum 411 is rotated in the second direction (e.g., the counterclockwise direction). As another example, the first drum 411 and the second drum 412 may be rotated in the same direction, and winding states of the tension transmitting members may be different such that the states of the tension transmitting members wound on the drums may be different. For example, while the first drum 411 is rotated in the clockwise direction, the first drum 411 may perform an operation of the first tension transmitting member 531 being wound thereon, and while the second drum 412 is rotated in the clockwise direction, the second drum 412 may perform an operation of the second tension transmitting member 532 being unwound therefrom. Alternatively, while the first drum 411 is rotated in the counterclockwise direction, the first drum 411 may perform an operation of the first tension transmitting member 531 being unwound therefrom, and while the second drum 412 is rotated in the counterclockwise direction, the second drum 412 may perform an operation of the second tension transmitting member 532 being wound thereon.

The first fixing part 431 may fix an end (e.g., the −y axis periphery of the first drum 411) of one side of the first drum 411 to the first housing 310 while the first drum 411 is rotatable, and may fix the first type sliding driving part 400a to the first housing 310 such that the first type sliding driving part 400a is not moved. The second fixing part 432 may fix an end (e.g., they axis periphery of the second drum 412) of one side of the second drum 412 to the first housing 310 while the second drum 412 is rotatable, and may fix the first type sliding driving part 400a to the first housing 310 such that the first type sliding driving part 400a is not moved. The first fixing part 431 and the second fixing part 432 may include a holding space, in which at least a portion of the first drum 411 and the second drum 412 is held, and may include a coupling structure (e.g., a coupling hole) that is to be coupled to the first housing 310. A coupling member, such as a screw, may be disposed in the coupling structure to fix the first fixing part 431 and the second fixing part 432 to the first housing 310.

Referring to FIGS. 5A and 5B, the rollable electronic device 100 may be in a state (or operation), in which the screen display area (or a display area or an exposure area) is opened or closed according to an input by a user or execution of an application. In this regard, the first type sliding driving part 400a fixed to the first housing 310 may include the first tension transmitting member 531 and the second tension transmitting member 532.

FIG. 5A illustrates a disposition state or an operation state of the first tension transmitting member 531 with a peripheral structure in relation to an open state and a close state. The first drum 411, on which at least a portion of the first tension transmitting member 531 is wound, may be disposed in and fixed to the first housing 310, and at least a portion of the first tension transmitting member 531 may be fixed to the display structure 160. That is, the first tension transmitting member 531 may be fixed to both the first housing 310 (by the sliding driving part) and the display structure 160.

Referring to FIG. 5A, according to an embodiment, in the open state, a length, by which the first tension transmitting member 531 is unwound, may be maximal. In the open state, the curved part 550 may be formed at a periphery (e.g., a periphery thereof in the x axis direction or a periphery thereof in a direction, in which the display area is opened) of the expandable exposure area 162. The first drum 411 and the second drum 412 may be rotated in the clockwise direction while a state of the rollable electronic device 100 is changed from the open state to the close state, and the first drum 411 and the second drum 412 may be rotated in the counterclockwise direction while the state of the rollable electronic device 100 is changed from the close state to the open state. In this regard, the first tension transmitting member 531 may be wound on the first drum 411 in the first direction, and the second tension transmitting member 532 may be wound on the second drum 412 in the second direction that is opposite to the first direction. As another example, while the state of the rollable electronic device 100 is changed from the open state to the close state, the first drum 411 may be rotated in the clockwise direction and the second drum 412, the movable pulley 321, and a fixed pulley 311 may be rotated in the counterclockwise direction. In this regard, the first tension transmitting member 531 may be wound on the first drum 411 in the first direction, and the second tension transmitting member 532 may be wound on the second drum 412 in the same direction as the first direction.

In the open state, an overlapping area between the second housing 320 and the first housing 310 may be minimal. Furthermore, in the open state, a non-overlapping area between the second housing 320 and the first housing 310 may be maximal. In the open state, the fixed exposure area 161 may be disposed to face a direction (e.g., the z axis direction), in which it may be observed from an outside, and at least a portion (or a whole area) of the expandable exposure area 162 extending from an end of the fixed exposure area 161 may be disposed in parallel to the fixed exposure area 161 (i.e., may be coplanar with each other). Furthermore, the fixed exposure area 161 and the expandable exposure area 162 may be disposed in a forward direction (e.g., the z axis direction) of the first housing 310, and may be observed from an outside. When the open state is changed to the close state, the curved part 550 may be formed between the fixed exposure area 161 and the expandable exposure area 162.

FIG. 5B illustrates a disposition state or an operation state of the second tension transmitting member 532 with a peripheral structure in relation to an open state and a close state. The fixed pulley 311, on which at least a portion of the second tension transmitting member 532 is wound, may be disposed in and fixed to the first housing 310, and the movable pulley 321, on which at least a portion of the second tension transmitting member 532 is wound, may be disposed in and fixed to the second housing 320. The second tension transmitting member 532 may be wound or unwound after an end (a starting portion of the tension transmitting member) thereof is fixed to the second drum 412, which has been described above, and an opposite end (e.g., an end in the x axis direction or an end in a direction, in which the display area is opened) thereof may be fixed to one side of the first housing 310. For example, an opposite end of the second tension transmitting member 532 may be fixed in an area that is adjacent to a point, at which the fixed pulley 311 is fixed.

According to an embodiment, in the close state, the movable pulley 321, on which the second tension transmitting member 532 is wound, may be disposed such that an interval from the second motor 422 or the second drum 412 is in a relatively short state (e.g., an state that is shorter than an interval between the second drum 412 and the movable pulley 321 in the open state according to movement of the second housing 320). While the state of the rollable electronic device 100 is changed from the close state to the open state, the second drum 412, the fixed pulley 311, and the movable pulley 321 may be rotated in the clockwise direction. While the state of the rollable electronic device 100 is changed from the close state to the open state, the first drum 411 may be rotated together in the counterclockwise direction. As another example, as mentioned above, the first drum 411 and the second drum 412 may be rotated in the same direction. In this case, while the first tension transmitting member 531 (or a first tension member) wound on the first drum 411 in the first direction is unwound from the first drum 411 (or wound on the first drum 411), the second tension transmitting member 532 (or a second tension member) wound on the second drum 412 in the second direction that is opposite to the first direction may be in an operation state, in which it is wound on the second drum 412 (or unwound from the second drum 412).

In the close state, the overlapping area between the second housing 320 and the first housing 310 may be maximal. The fixed exposure area 161 may be disposed to face a direction, in which it may be observed from an outside, in the close state, the expandable exposure area 162 extending from an end of the fixed exposure area 161 may be disposed (e.g., disposed in a direction that faces the –z axis direction from a surface that faces the –z axis direction) to face a rear surface of the first housing 310 (e.g., the rear surface of the first housing 310), and at least a portion of the expandable exposure area 162 may be disposed not to be observed from an outside. The curved part 550 may be disposed between the fixed exposure area 161 and the expandable exposure area 162 in the close state. When the state of the rollable electronic device 100 is changed from the close state to the open state, the curved part 550 may be formed at an end (e.g., an x axis periphery) of the expandable exposure area 162.

As described above, according to the rollable electronic device 100, movement of the first tension transmitting member 531 may directly pull the display structure 160 when the open state is changed to the close state, and movement of the second tension transmitting member 532 may push out the second housing 320 in the opening direction when the close state is changed to the open state. As described in FIG. 5A, since a force is applied such that a repulsive force of the display 160a is solved as the open state is changed to the close state when the first tension transmitting member 531 directly pulls the display structure 160, a separation problem (e.g., a separation phenomenon of the display structure 160) of the display 160a and the multi-bar 183, which occurs in state 391 of FIG. 3C above, may be alleviated.

Furthermore, as the second tension transmitting member 532 pushes the second housing 320 such that the close state of the rollable electronic device 100 is changed to the open state as described in FIG. 5B, separation or distortion of the display 160a, which occurs when the display 160a is directly pushed by the second housing 320 to be opened as illustrated in FIG. 5C, may be improved.

Figure 6A:
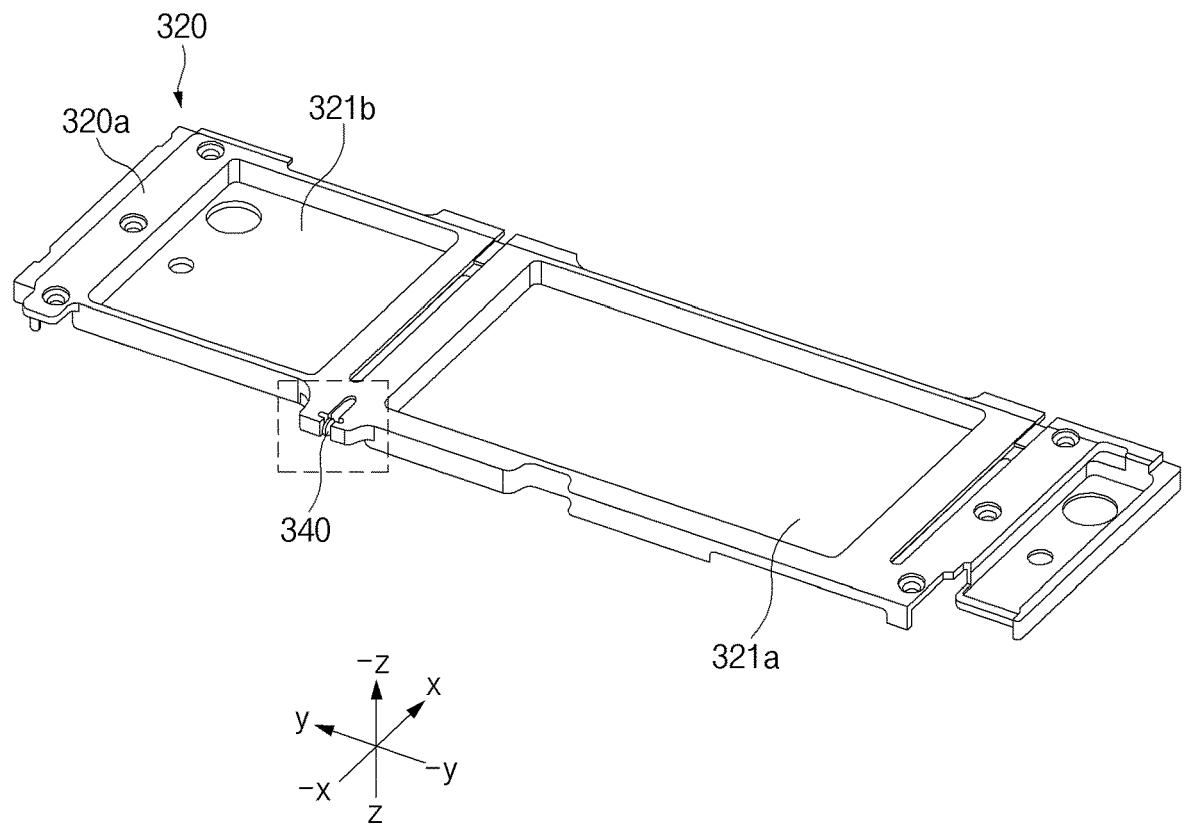
FIG. 6A is a perspective view illustrating an example of a second housing according to an embodiment.
Figure 6B:
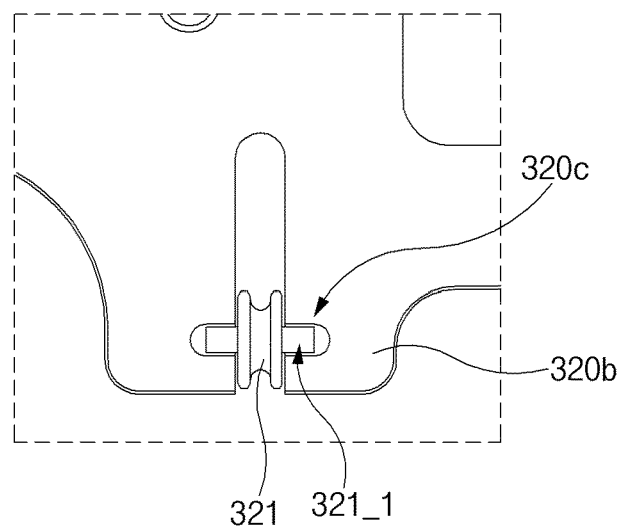
FIG. 6B is an enlarged plan view of portion 302 in FIG. 6A.

FIG. 6A is a perspective view illustrating an example of a second housing according to an embodiment, and FIG. 6B is an enlarged plan view of portion 302 in FIG. 6A.

Referring to FIGS. 1 to 6B, the second housing 320 according to an embodiment may include a housing body 320a formed long in one direction (e.g., the y axis or the –y axis), and a movable pulley disposition part 340, in which the movable pulley 321 is disposed on one side (e.g., one point of a –x axis periphery thereof) of the housing body 320a.

A width of the housing body 320a in an opposite direction (e.g., the x axis direction) that is perpendicular to one direction (e.g., the y axis direction) may be shorter than a length thereof in the one direction (e.g., the y axis direction). Alternatively, when a length of the rollable electronic device 100 in a longitudinal direction (a direction that is perpendicular to a landscape mode screen in a state, in which the landscape mode screen is displayed on the display) is longer than a length thereof in a transverse direction (e.g., a direction that is perpendicular to the longitudinal direction, and is a landscape mode direction), a width of the housing body 320a in an opposite direction (e.g., the x axis direction) that is perpendicular to one direction (e.g., the y axis direction) may be longer than a length thereof in the one direction (e.g., they axis direction).

According to an embodiment, the housing body 320a may include a first battery disposition area 321a, in which the first battery (e.g., the first battery 121 of FIG. 4B) is disposed, and a second battery disposition area 321b, in which the second battery (e.g., the second battery 122 of FIG. 4B) is disposed. In consideration of an efficiency of the batteries, in an environment, in which two batteries have to be disposed, a battery of a larger capacity may be manufactured in an aspect of manufacturing of the battery when one battery is formed to be larger than the other battery rather than when the batteries have the same size. Accordingly, the first battery disposition area 321a may have a shape that is larger than the second battery disposition area 321b and is engraved (e.g., engraved in the z axis direction from the –z axis direction).

The movable pulley disposition part 340 may be disposed in a border area of the first battery disposition area 321a and the second battery disposition area 321b. The movable pulley disposition part 340 may have a shape that protrudes farther than peripheral portions (or a shape that protrudes in the –x axis direction). In this regard, the movable pulley disposition part 340 may include a protruding portion 320b that protrudes from one side (e.g., one point of a –x axis periphery) of the housing body 320a in the –x axis direction, and a movable pulley disposition recess 320c formed on one side of the protruding portion 320b, and the movable pulley 321 may be seated in the movable pulley disposition recess 320c. The movable pulley disposition recess 320c, for example, may have a cross-shaped recess (or hole). According to various embodiments, an additional structure may be further disposed in the movable pulley disposition part 340 such that the movable pulley 321 does not deviate from the movable pulley disposition recess 320c after the movable pulley 321 is seated in the movable pulley disposition recess 320c. For example, the movable pulley disposition part 340 may further include a cover that covers at least a portion of the movable pulley disposition recess 320c or a fixing pin such that a shaft 321_1 of the movable pulley 321 does not deviate from the movable pulley disposition recess 320c after the movable pulley 321 is held in the movable pulley disposition recess 320c. At least a portion of the second tension transmitting member 532 described above may be held on the movable pulley 321. A location of the movable pulley 321 may be changed according to movement of the second housing 320 while the movable pulley 321 is fixed to the second housing 320 and is rotated by the second tension transmitting member 532.

Meanwhile, in the above description of the movable pulley disposition part 340, the protruding portion 320b has been exemplified but the disclosure is not limited thereto. For example, the protruding portion 320b may be omitted, and a part, in which the movable pulley 321 is disposed, may have a flat structure that is similar to that of adjacent peripheral areas or may not protrude but be engraved contrarily (e.g., formed to be concave in the x axis direction).

Figure 7A:
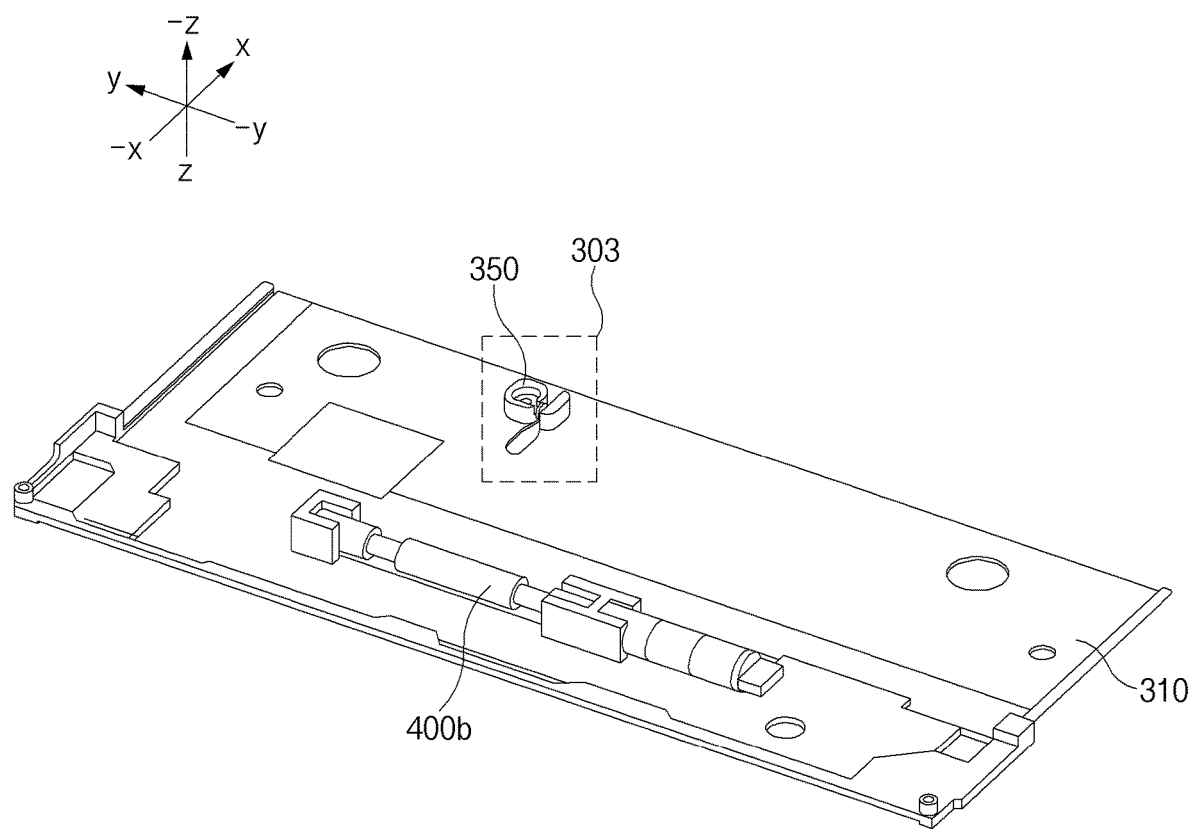
FIG. 7A is a perspective view illustrating an example of a fixed pulley disposition part of a first housing according to an embodiment.
Figure 7B:
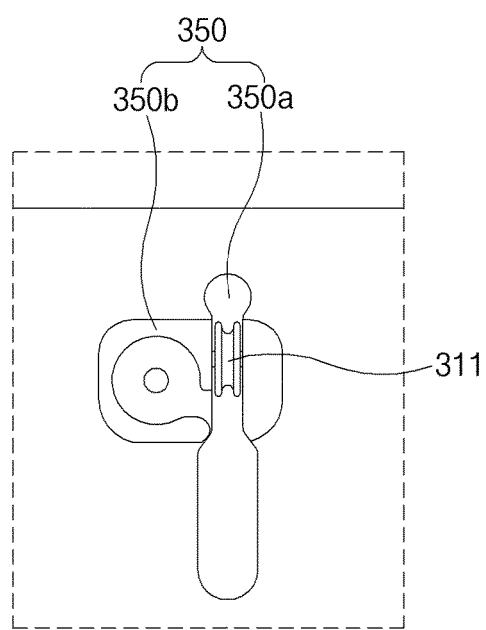
FIG. 7B is an enlarged plan view of portion 303 in FIG. 7A.
Figure 8:
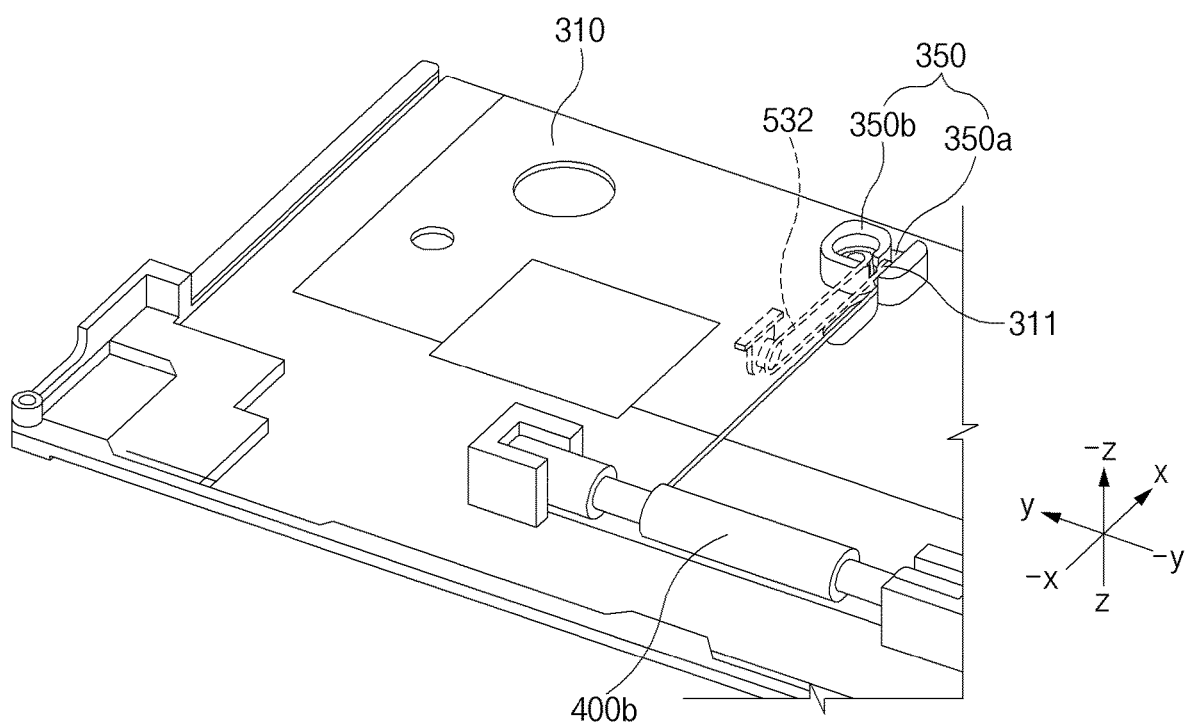
FIG. 8 is a perspective view illustrating an example of connection of a tension transmitting member of a first housing according to an embodiment.

FIG. 7A is a perspective view illustrating an example of a fixed pulley disposition part of a first housing according to an embodiment, and FIG. 7B is an enlarged plan view of portion 303 in FIG. 7A. FIG. 8 is a view illustrating an example of connection of the second tension transmitting member of the first housing according to an embodiment.

Referring to FIGS. 4A to 8, the first housing 310 may have a shape, of which a length in one direction (e.g., the y axis direction) is larger than a length thereof in an opposite direction (e.g., the x axis or −x axis direction that is perpendicular to the one direction), and may include a fixed pulley disposition part 350 formed at a location (e.g., a location disposed in parallel in the x axis direction) corresponding to the movable pulley disposition part 340 described above in FIGS. 6A and 6B. Additionally, a second type sliding driving part 400b may be disposed on one side of the first housing 310.

The fixed pulley disposition part 350, for example, may be disposed at a location that is biased from a center in the y axis direction to a y axis periphery thereof. Furthermore, the fixed pulley disposition part 350 may be disposed to be close to the x axis periphery. The fixed pulley disposition part 350 may include a fixed pulley disposition recess 350a (or a hole), in which the fixed pulley 311 is disposed, and a tension fixing part 350b disposed to be adjacent to the fixed pulley disposition recess 350a. The fixed pulley disposition recess 350a, for example, may have a hole shape that passes in the z axis or −z axis direction and of which a width in the x axis direction is larger than a width thereof in the y axis direction. The fixed pulley 311 may be disposed on and fixed to one side of the fixed pulley disposition recess 350a. As an example, the fixed pulley 311 may be disposed in a specific space between an upper side (e.g., one point in the x axis direction on the xy plane) of the fixed pulley disposition recess 350a and a lower side (e.g., one point in the −x axis direction on the xy plane) thereof. According to various embodiments, the fixed pulley 311 may further include a shaft that is coupled to an adjacent tension fixing part 350b and one side of the first housing 310. At least a portion of the second tension transmitting member 532 may be inserted into the fixed pulley disposition recess 350a, and one end of the second tension transmitting member 532 may be fixed to the tension fixing part 350b after a portion thereof is held on the movable pulley 321 via the fixed pulley 311.

The tension fixing part 350b may include a recess or a hole, into which at least a portion of the second tension transmitting member 532 may be inserted to be fixed. As an example, the tension fixing part 350b may be formed such that at least a portion thereof protrudes in the −z axis direction with respect to a front surface of the first housing 310. A central portion of the tension fixing part 350b may have a structure that is recessed to be lower than peripheral portions thereof, and a hole, into which at least a portion of the second tension transmitting member 532 may be inserted or a ring, to which it may be fixed, may be disposed at a central point of the central portion. After a portion of the second tension transmitting member 532 is inserted into or held on the above-described tension fixing part 350b, the second tension transmitting member 532 may be fixed to the tension fixing part 350b according to disposition of an additional structure (e.g., a coupling structure that may be filled in an engraved portion of the engraved tension fixing part 350b or a structure that may be interference-fitted in the engraved part). Additionally, in relation to firmer fixing of the second tension transmitting member 532, an adhesive material or an adhesive member may be further disposed between the additional structure and the tension fixing part 350b.

FIG. 8 illustrates only disposition of the fixed pulley disposition recess 350a and the second tension transmitting member 532 between the second type sliding driving part 400b and the tension fixing part 350b. Additionally, the second tension transmitting member 532 may be connected to the movable pulley 321 formed in the second housing 320 described above in FIGS. 6A and 6B. For example, the second tension transmitting member 532 may be formed such that at least a portion thereof is fixed to and wound on the drum formed on one side of the second type sliding driving part 400b, and may be disposed to be fixed to the tension fixing part 350b again after being coupled to the fixed pulley 311 through the fixed pulley disposition recess 350a of the first housing 310 and then being coupled to the movable pulley 321 through the movable pulley disposition recess 320c disposed on one side of the second housing 320.

The second type sliding driving part 400b may be disposed in parallel in the y axis direction on one surface (e.g., a surface that faces the −z axis direction) of the first housing 310. The second type sliding driving part 400b may drive the first tension transmitting member 531 and the second tension transmitting member 532, which have been described above in FIGS. 4A and 4B. The second type sliding driving part 400b may include a drum, to which the second tension transmitting member 532 may be fixed, and may perform an operation of winding or unwinding the second tension transmitting member 532 according to a rotational direction of the drum.

Although it has been exemplified in the above description that the fixed pulley disposition part 350 protrudes from a bottom surface of the first housing 310, which faces the −z axis, in the −z axis direction, but the disclosure is not limited thereto. For example, the fixed pulley disposition part 350 may have a shape that protrudes from one surface of the first housing 310 that faces the z axis, in the z axis direction.

Figure 9:
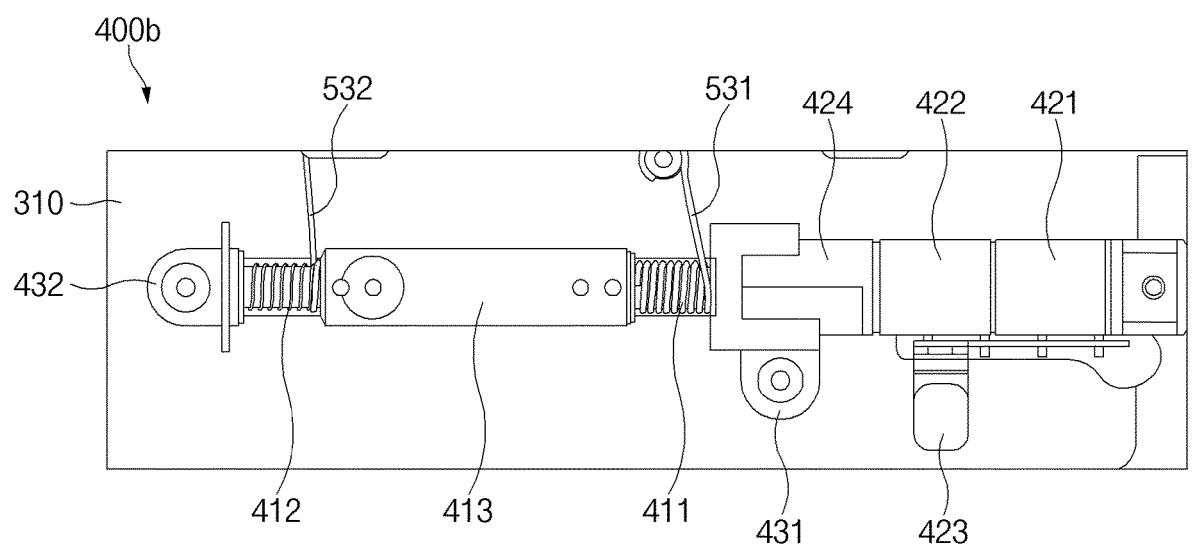
FIG. 9 is a plan view illustrating an example of a second type sliding driving part according to an embodiment.

FIG. 9 is a view illustrating an example of the second type sliding driving part according to an embodiment.

Referring to FIGS. 7 to 9, the second type sliding driving part 400b may include at least one motor (e.g., the first motor 421 and the second motor 422), a reduction gear 424, the driving circuit 423, the first drum 411, a drum connector 413, the second drum 412, the first fixing part 431, and the second fixing part 432.

The first motor 421 and the second motor 422 may have configurations that are the same as or similar to those of the first motor 421 and the second motor 422, which have been described above in FIG. 4B. At least one of the first motor 421 and the second motor 422 may provide thrusts for driving the first drum 411 and the second drum 412. The first motor 421 and the second motor 422 may be replaced by one motor, and a size of the one motor may be larger than a size of each of the motors 421 and 422 to obtain the thrusts of the first motor 421 and the second motor 422 connected in series to each other. As an example, when the second type sliding driving part 400b is not limited by a slim shape of the rollable electronic device 100, one motor may be included, and when the rollable electronic device 100 needs to be slimmed, the plurality of motors 421 and 422 connected in series to each other may be disposed.

The first motor 421 and the second motor 422 are examples of two motors for providing power that is necessary for operations of winding or unwinding the first tension transmitting member 531 and the second tension transmitting member 532, and three or more motors may be disposed if necessary. The first motor 421 and the second motor 422 may be rotated in the first direction (or the second direction that is opposite to the first direction) in correspondence to control signals and power delivered through the driving circuit 423, and may transmit the power generated due to the rotation to the drum structure (e.g., the first drum 411, the second drum 412, and the drum connector 413) via the reduction gear 424. According to various embodiments, the first drum 411 and the second drum 412 may be integrally formed, and diameters of the first drum 411 and the second drum 412 may be the same or different. When the first drum 411 and the second drum 412 are rotated at the same rpm by the motors 421 and 422 while the above-described second tension transmitting member 532 uses only a fixed pulley structure, a diameter of the second drum 412 may be formed to be a half of a diameter of the first drum 411 such that a length of the second tension transmitting member 532, which is wound on the second drum 412, is a half of a length of the first tension transmitting member 531, which is wound on the first drum 411. The first motor 421 and the second motor 422 may be connected to each other by the same shaft, or may have a structure, by which the shafts thereof are connected to each other.

The reduction gear 424 may reduce speeds of rotational forces transmitted from the first motor 421 and the second motor 422. The reduction gear 424 may transmit the reduced power to the drum structure. The reduction gear 424 may transmit the power generated according to rotational directions of the first motor 421 and the second motor 422 to the drum structure. For example, when the first motor 421 and the second motor 422 are rotated in the clockwise direction, the reduction gear 424 may reduce the clockwise rotational forces transmitted from the first motor 421 and the second motor 422 to a specific speed in correspondence to a gear pattern and then may transmit the reduced rotational forces to the drum structure. Furthermore, when the first motor 421 and the second motor 422 are rotated in the counterclockwise direction, the reduction gear 424 may reduce the counterclockwise rotational forces transmitted from the first motor 421 and the second motor 422 to a specific speed in correspondence to a gear pattern and then may transmit the reduced rotational forces to the drum structure. In this regard, the reduction gear 424 may further include a shaft connected to at least a portion (e.g., the first drum 411) of the drum structure. The first type sliding driving part 400a described above in FIGS. 4A and 4B is an example of a structure, in which at least one motor is disposed between the two drums 411 and 412 in consideration of a mounting space, and as illustrated in FIGS. 7 to 9, two drums are connected to each other through the drum connector 413, at least one motor is connected to one side (e.g., a −y axis periphery of the first drum 411) of the first drum 411 (or the second drum 412) through the reduction gear 424, and the thrust generated by the at least one motor may be transmitted to drive the plurality of drums 411 and 412. Here, although one motor may be applied to generate thrusts for rotating the drums 411 and 412, a plurality of motors having relatively small sizes as compared with that of the one motor in the one motor applied environment may be disposed to be connected in series to each other in an environment, in which a relatively large motor cannot be applied for the purpose of generating thrusts for rotating the plurality of drums 411 and 412 (e.g., an environment for slimness of the rollable electronic device 100).

The first drum 411 may be connected to the reduction gear 424 to be rotated according to the power transmitted by the reduction gear 424. The first drum 411 may be connected to the second drum 412 through the drum connector 413, or may be integrally formed. According to an embodiment, the first drum 411 may be rotated in the same direction as that of the second drum 412 in correspondence to supply of the thrusts of the plurality of motors 421 and 422 connected in series to each other. For example, when the first drum 411 is rotated in the clockwise direction, the second drum 412 and the drum connector 413 may be rotated in the clockwise direction, and when the first drum 411 is rotated in the counterclockwise direction, the second drum 412 and the drum connector 413 may be rotated in the counterclockwise direction. According to various embodiments, when the at least one motor (e.g., the first motor 421 and the second motor 422) is located between the first drum 411 and the second drum 412 (e.g., the motor driving part of FIG. 4B, which has been described above), the first drum 411 and the second drum 412 may be rotated in the same direction but may be rotated in opposite directions.

A guide groove (or an embossed spiral guide boss) engraved on a surface of the drum may be formed in each of the first drum 411 and the second drum 412 such that the tension transmitting member is prevented from being twisted or overlapped during an operation of winding and unwinding the first tension transmitting member 531 and the second tension transmitting member 532. The guide groove, as illustrated, may have a spiral shape (or a spiral thread shape) such that the tension transmitting members (e.g., the first tension transmitting member 531 and the second tension transmitting member 532) are prevented from overlapping each other while being wound or unwound. The drum connector 413 may be a configuration that is disposed between the first drum 411 and the second drum 412 and connects the first drum 411 and the second drum 412. The drum connector 413 may be rotated in the same direction as that of the first drum 411 and the second drum 412. A width of the drum connector 413 may vary according to a spacing distance between the first tension transmitting member 531 and the second tension transmitting member 532. For example, a length of the drum connector 413 in the y axis direction may become larger when a spacing distance between the first tension transmitting member 531 and the second tension transmitting member 532 becomes larger, and a length of the drum connector 413 in the y axis direction may become smaller when a spacing distance between the first tension transmitting member 531 and the second tension transmitting member 532 in the y axis direction becomes smaller.

The first fixing part 431 may include a holding part, in which one side of the reduction gear 424 and the first drum 411 is held, and a fixing hole that fixes the holding part to the first housing 310. A through-hole, through which a shaft, by which the reduction gear 424 and the first drum 411 are connected to each other, pass, may be formed in the holding part. At least a portion of the coupling member may be inserted into the fixing hole to fix the first fixing part 431 to the first housing 310.

The second fixing part 432 may include a holding part, in which one side of the second drum 412 is held, and a fixing hole that fixes a part, in which the second drum 412 is held, to the first housing 310. The second fixing part 432 may have a structure that is similar to that of the first fixing part 431. Furthermore, a disposition direction of the second fixing part 432 may be different from that of the first fixing part 431. As an example, the second fixing part 432 may be fixed to the first housing 310 in a direction that is perpendicular to a direction, in which the first fixing part 431 is fixed. The first fixing part 431 and the second fixing part 432 may be disposed to fix only at least a portion of each structure of the second type sliding driving part 400b such that the first drum 411 and the second drum 412 are rotated in the clockwise direction and the counterclockwise direction, respectively, even though the first fixing part 431 and the second fixing part 432 fix the above-described second type sliding driving part 400b.

According to various embodiments, at least one of the first fixing part 431 and the second fixing part 432 may further include a bearing structure. The first fixing part 431 and the second fixing part 432 may reduce frictions based on a bearing structure that contacts the shafts included in the drums 411 and 412 to improve loss of driving forces and alleviate jitters and joints by minimizing gaps (e.g., gaps between the fixing parts 431 and 432 and the drums 411 and 412) between the structures.

Figure 10:
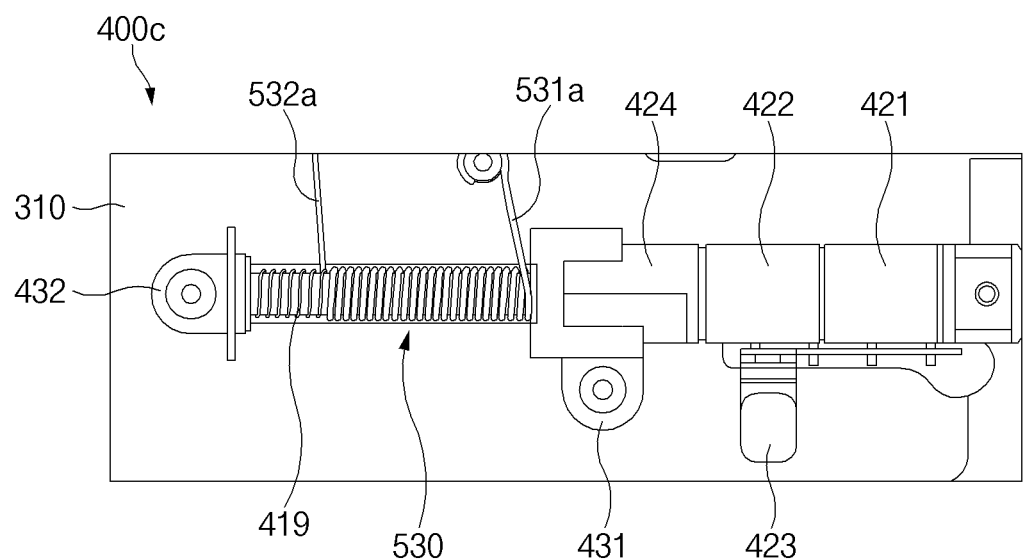
FIG. 10 is a plan view illustrating an example of a third type sliding driving part according to an embodiment.

FIG. 10 is a view illustrating an example of a third type sliding driving part according to an embodiment.

Referring to FIGS. 7 to 10, a third type sliding driving part 400c may include the first motor 421, the second motor 422, the reduction gear 424, the driving circuit 423, an integrated drum 419, the first fixing part 431, and the second fixing part 432.

The first motor 421 and the second motor 422 may have configurations that are the same as or similar to those of the first motor 421 and the second motor 422, which have been described above in FIGS. 4A and 9. The first motor 421 and the second motor 422 are examples of two motors for providing power that is necessary for operations of winding or unwinding the first tension transmitting member 531 and the second tension transmitting member 532, and one motor that may generate a relatively high thrust may be applied when there is no purpose of slimming the rollable electronic device 100. When a size of the motor needs to be not larger than a specific size for slimness of the rollable electronic device 100, three or more motors of a size that is smaller than that of the two motors 421 and 422 may be configured to cope with thrusts that are to be generated by the two motors 421 and 422. The first motor 421 and the second motor 422 connected in series to each other may be rotated in the first direction (or the second direction that is opposite to the first direction) in correspondence to control signals and power delivered through the driving circuit 423, and may transmit the power generated due to the rotation to the integrated drum 419 via the reduction gear 424.

The reduction gear 424 may reduce speeds of rotational forces transmitted from the first motor 421 and the second motor 422. The reduction gear 424 may have a configuration that is the same as or similar to that of the reduction gear 424 described above in FIG. 9. For example, when the first motor 421 and the second motor 422 are rotated in the clockwise direction (or the counterclockwise direction), the reduction gear 424 may reduce the clockwise (or counterclockwise) rotational forces transmitted from the first motor 421 and the second motor 422 to a specific speed in correspondence to a gear pattern and may transmit the reduced rotational forces to the integrated drum.

The integrated drum 419 may be connected to the reduction gear 424 to be rotated according to the power transmitted by the reduction gear 424. One tension transmitting member 530 may be wound on the integrated drum 419. The one tension transmitting member 530 may include a first tension transmitting member part 531a and a second tension transmitting member part 532a. The first tension transmitting member part 531a may be coupled to the display structure 160 to be used to directly pull the display structure 160 (e.g., used to pull the display structure 160 in the −x axis direction). The second tension transmitting member part 532a may be used to directly push the second housing 320 (e.g., used to push or move the display structure 160 in the x axis direction or unwind the wound area of the display structure 160 in the x axis direction). A guide groove that guides the tension transmitting member may be engraved or a guide boss may be embossed to form a spiral shape of the integrated drum 419 such that the first tension transmitting member part 531a and the second tension transmitting member part 532a are prevented from being overlapped or twisted while being wound or unwound. As an example, the second housing 320 may be moved in a direction (e.g., the −x direction), in which an overlapping area thereof with the first housing 310 becomes lager, while the first tension transmitting member part 531a pulls the display structure 160 while being wound on the integrated drum 419 and the second tension transmitting member part 532a is unwound while the first tension transmitting member part 531a is wound on the integrated drum 419 when the integrated drum 419 is rotated in the clockwise direction. Furthermore, the expandable exposure area 162 of the display structure, which is exposed to the outside, may become gradually larger, while the second tension transmitting member part 532a pushes the second housing 320 while being wound on the integrated drum 419 and the first tension transmitting member part 531a is unwound while the second tension transmitting member part 532a is wound when the integrated drum 419 is rotated in the counterclockwise direction.

The first fixing part 431 and the second fixing part 432 have configurations that are the same as or similar to those of the first fixing part 431 and the second fixing part 432, which have been described above in FIG. 9. For example, the first fixing part 431 and the second fixing part 432 may be disposed such that the third type sliding driving part 400c is fixed to the first housing 310. The first fixing part 431 and the second fixing part 432 may include a bearing structure, and may reduce gaps between the shafts included in the integrated drum 419 and the fixing parts 431 and 432 while reducing the frictional forces with the shafts when the integrated drum 419 is rotated.

According to the above-described rollable electronic device 100, a guide groove that guides a tension transmitting member is provided on the drum, on which the tension transmitting member is wound or unwound, whereby degradation of a driving force may be restrained by constantly maintaining a distance, by which the tension transmitting member is wound.

Figure 11:
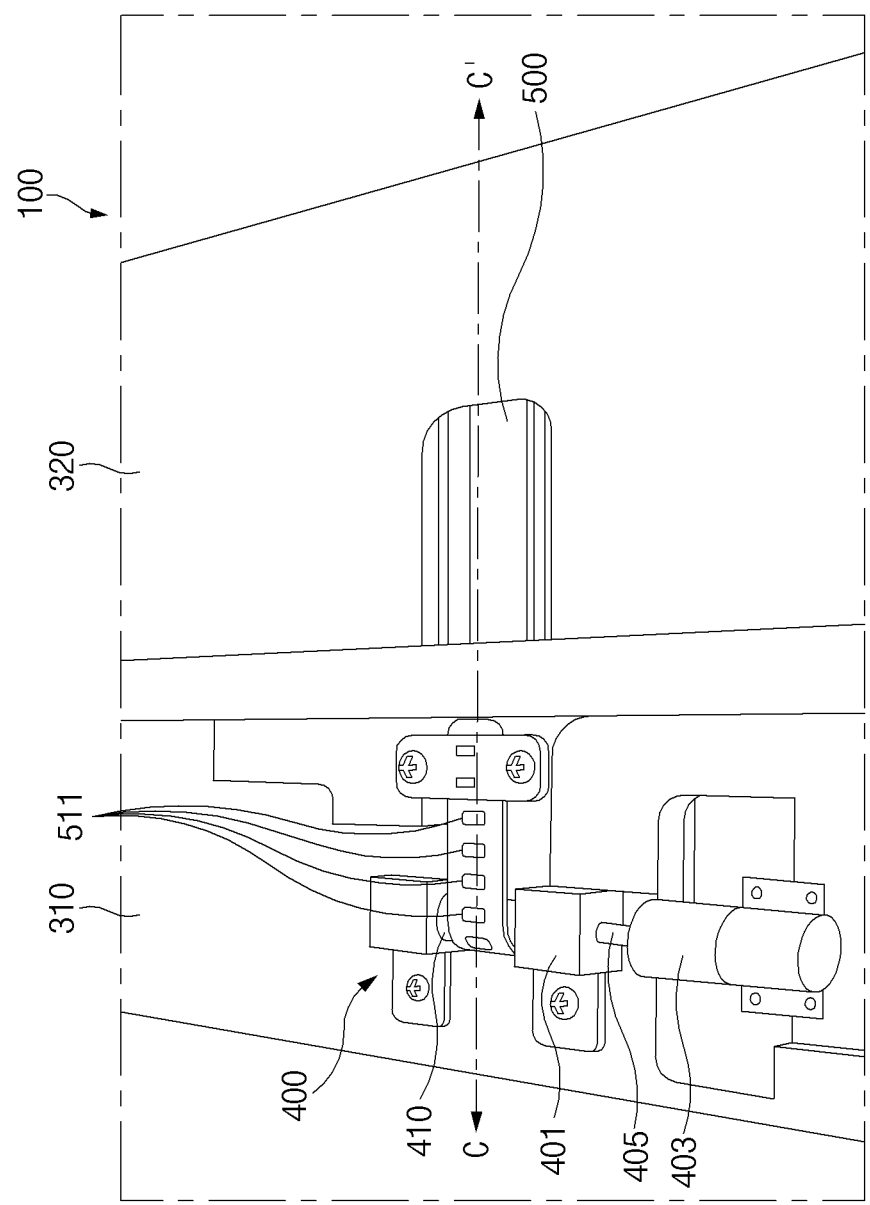
FIG. 11 is a perspective view illustrating an example of a structure including a fourth type sliding driving part and some surrounding configurations according to an embodiment.
Figure 12:
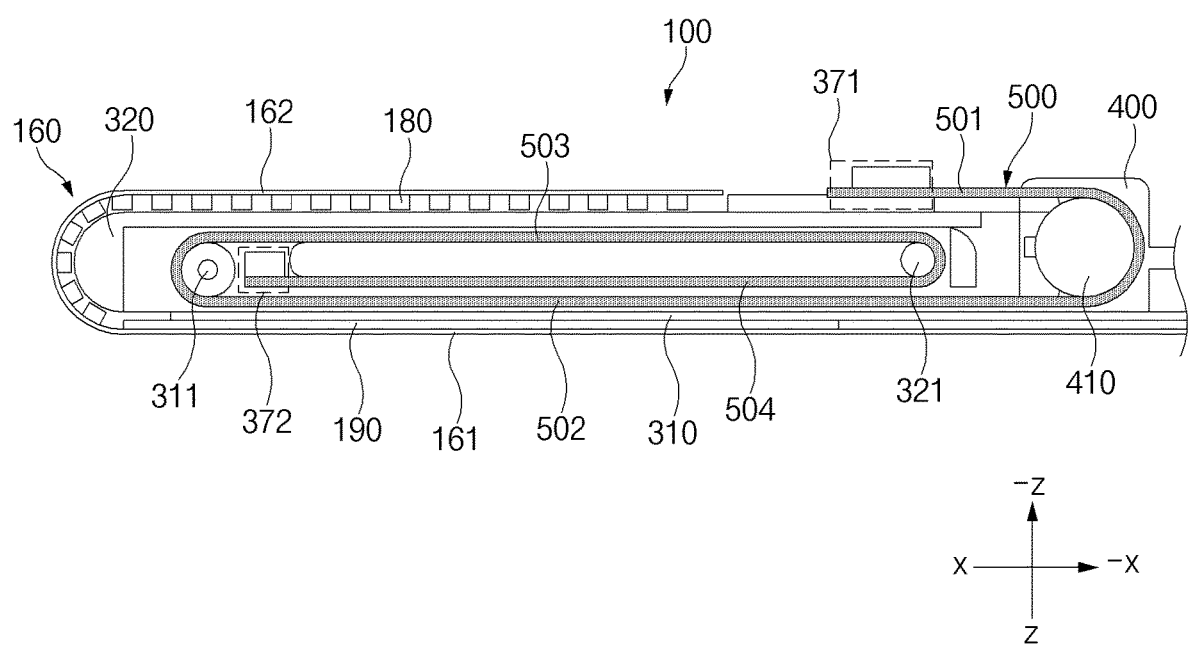
FIG. 12 is a cross-sectional view illustrating an example of a cross-section along line C-C' of FIG. 11.
Figure 13A:
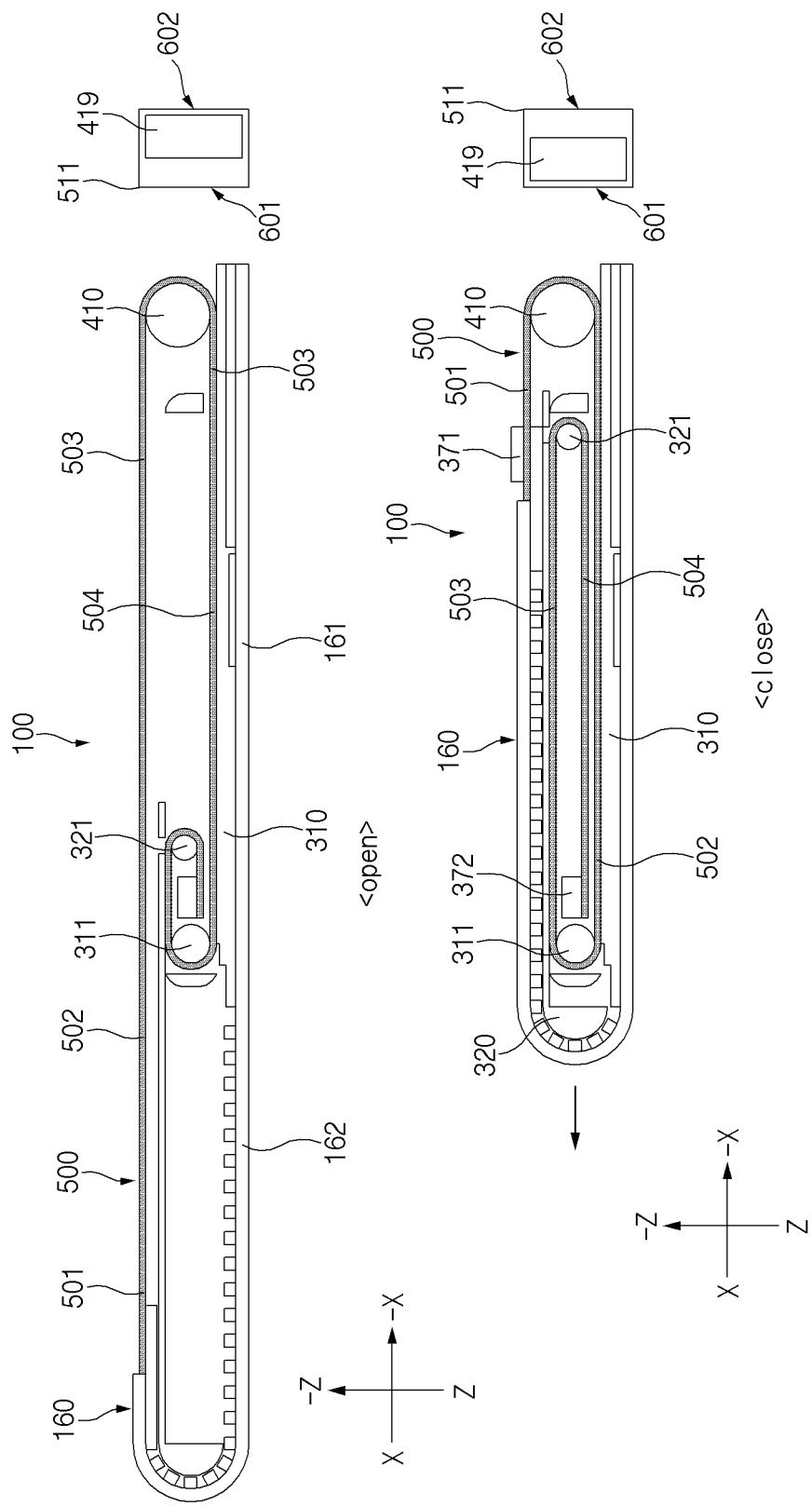
FIG. 13A are cross-sectional views illustrating an example of an operation of a fourth type sliding driving part according to an embodiment.
Figure 13B:
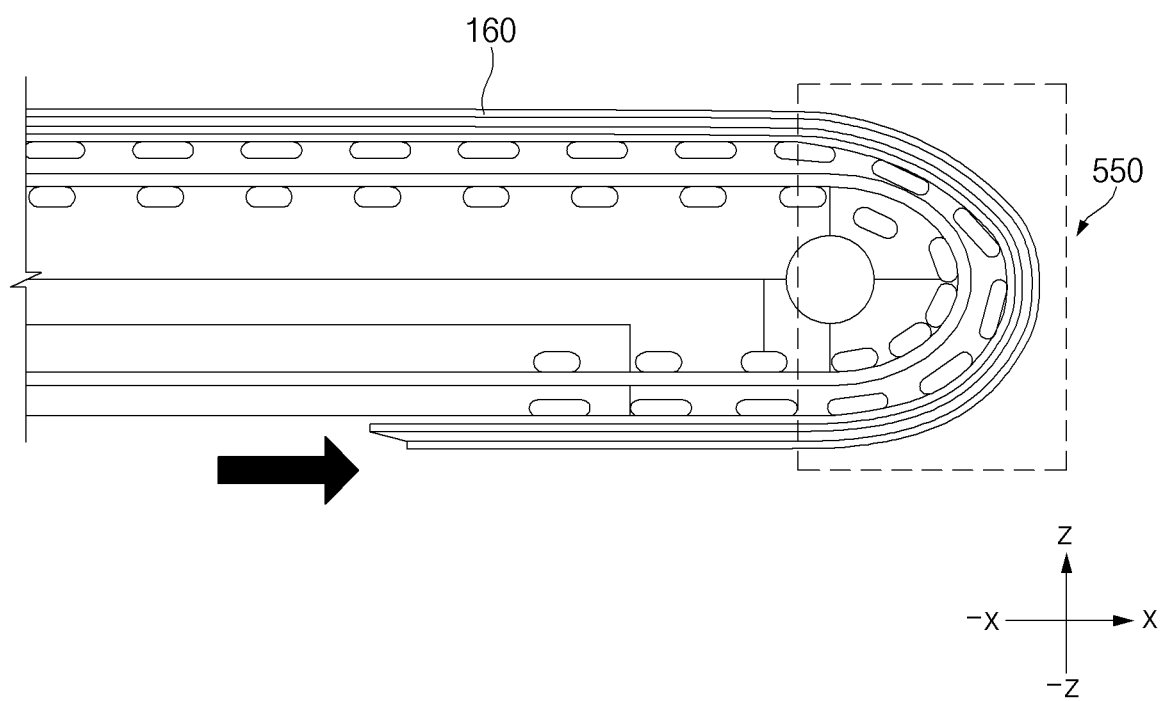
FIG. 13B is a cross-sectional view related to a driving force generated in a process of opening and closing a display structure.

FIG. 11 is a view illustrating an example of a structure including a fourth type sliding driving part and some surrounding configurations according to an embodiment. FIG. 12 is a view illustrating an example of a cross-section along line C-C' of FIG. 11. FIG. 13A is a view illustrating an example of an operation of the fourth type sliding driving part according to an embodiment. FIG. 13B is a view related to a driving force generated in a process of opening and closing the display structure.

Referring to FIGS. 11 and 12, a fourth type sliding driving part 400 according to an embodiment may include a tension transmitting member 500 connected to the display structure 160 and the second housing 320, a drum 410 for an operation of winding the tension transmitting member 500, a drum fixing part 401 that fixes the drum, a power part 403 that generates power for rotating the drum 410, and a connection shaft 405 that connects the power part 403 and the drum 410.

The display structure 160, as described above, may include the fixed exposure area 161 that is exposed in the z axis direction in a state, in which the rollable electronic device is closed, and the expandable exposure area 162 disposed to face the −z axis direction. The expandable exposure area 162 may include the support structure 180 including the plurality of multi-bars 183, and according to a sliding operation, an end of the support structure 180 in the x axis direction may define a curved surface and an area of the display 160a, which is located on an upper side of the support structure 180, also may define a curved surface. A first member fixing part 371 that fixes one side of the tension transmitting member 500 may be disposed at an end (e.g., an end of the display structure 160 disposed on an inner side of the housing cover, in the −x axis direction) of the display structure 160. The first member fixing part 371 may have various structures for fixing the tension transmitting member 500, for example, a structure of a ring or a hole for fixing the tension transmitting member 500. Alternatively, the first member fixing part 371 may include a fixing structure fixed to one side of the display structure 160 while pressing the tension transmitting member 500 upwards and downwards with the tension transmitting member 500 being interposed therebetween. The first member fixing part 371 may be disposed in the display structure 160 after a portion of the display structure 160 is deformed or after being formed as a separate structure. According to various embodiments, an end (a peripheral end of the display structure 160 disposed on an inner side of the housing cover 210, in the −x axis direction) of the display structure 160 may include a black matrix (BM) area of the display 160a of the display structure, in which no image is displayed in the display structure 160, an outer area of the BM area, an area, located on an opposite direction to the BM area, and an area located on an opposite direction to the outer area of the BM area.

One side of the first housing 310 may include the fixed pulley 311, on which one side of the tension transmitting member 500 is wound, and a second member fixing part 372, to which an end of the tension transmitting member 500 is fixed. The fixed pulley 311 may be rotated while the tension transmitting member 500 is moved with a location thereof not being changed. The second member fixing part 372 may have various structures for fixing the tension transmitting member 500, for example, a hole, a ring, or various other fixing structures. The fixed pulley 311 and the second member fixing part 372 may be disposed in the first housing 310 such that a location thereof is not changed and is maintained in a fixed state even while the second housing 320 is moved.

The second housing 320 may be moved in the x axis direction or the −x axis direction according to manipulation of the tension transmitting member 500 while being disposed on one side of the first housing 310. The movable pulley 321 may be disposed in the second housing 320. One side of the tension transmitting member 500 may be wound on the movable pulley 321.

The tension transmitting member 500 may include one end that is fixed to one side or the display structure 160 through the first member fixing part 371, and an opposite end that is fixed to the first housing 310 through the second member fixing part 372. As an example, when the rollable electronic device 100 is in the close state described above in FIG. 1, the tension transmitting member 500 may include a first part 501 from an end of one side thereof connected to the display structure 160 to a portion thereof wound on the drum 410, a second part 502 from a portion thereof wound on the drum 410 to a portion thereof wound on the fixed pulley 311 disposed on one side of the first housing 310, a third part 503 from a portion thereof wound on the fixed pulley 311 to a portion thereof wound on the movable pulley 321 disposed in the second housing 320, and a fourth part 504 from a portion thereof wound on the movable pulley 321 to the second member fixing part 372 disposed in the first housing 310. The tension transmitting member 500 may be operated to move the second housing 320 in the x axis direction or the −x axis direction. As an example, while the expandable exposure area 162 is disposed to face the z axis direction, at least a portion of the second part 502 of the tension transmitting member 500 may be disposed in parallel to the first part 501 via the drum 410. To smoothly rotate the tension transmitting member 500, a plurality of bosses protruding from a center of a body thereof outwards may be disposed at a specific interval to smoothly rotate the tension transmitting member 500. Member holes 511 engaged with the bosses formed in the drum 410 may be formed at a specific interval at least a portion (e.g., at least a portion of the first part 501 of the tension transmitting member 500 or at least a portion of the second part 502) of the tension transmitting member 500. As another example, the member holes 511 may be formed in the entire tension transmitting member 500. For example, the member holes 511 may be formed in the tension transmitting member 500 in a groove or recess shape.

The connection shaft 405 may be inserted into a central portion of the drum 410, and at least a portion of the tension transmitting member 500 may contact an outer surface of the drum 410. The drum 410 may have a structure, on which the tension transmitting member 500 may be wound. For example, a convexo-concave pattern that may increase a frictional force may be formed on a surface of the drum 410, which contacts the tension transmitting member 500, such that the tension transmitting member 500 may be wound thereon. Furthermore, at least one boss that may be temporarily inserted into the member hole 511 formed in the tension transmitting member 500 may be disposed on a surface of the drum 410. As a portion of the connection shaft 405 inserted into a central portion of the drum 410 is rotated, the drum 410 may be rotated in a clockwise direction or a counterclockwise direction.

The drum fixing parts 401 may be disposed on opposite sides of the drum 410, and may function to fix the drum 410 such that the drum 410 is prevented from deviating from a specific location. In this regard, the drum fixing part 401 may include a through-hole, through which a portion of the connection shaft 405 may pass, and a holding recess, in which an end of the connection shaft 405 or an end of one side of the drum 410 may be held.

The power part 403 may generate power for rotating the drum 410, and may provide the power to the drum 410 through the connection shaft 405. The power part 403, for example, may include at least one motor. The power part 403 may generate a rotational force that rotates the connection shaft 405 in the clockwise direction or counterclockwise direction, in correspondence to control of the processor disposed in the above-mentioned printed circuit boards 151 and 152.

One side of the connection shaft 405 may be connected to the power part 403, and an opposite side thereof may be connected to the drum 410. The connection shaft 405 may function to transmit the rotational force generated by the power part 403, to the drum 410.

Referring to FIG. 13A, when receiving an input signal (e.g., an input signal that requests the expandable exposure area 162 to be exposed to the outside) related to a change in a disposition state of the expandable exposure area 162 from an input device (e.g., a physical key button, a voice input device, a touch gesture input unit, or an input sensor that may sense an operation of shaking the rollable electronic device 100) included in the rollable electronic device 100, the processor may move the second housing 320, to which the movable pulley 321 is fixed, by rotating the drum 410 (e.g., in the counterclockwise direction) in correspondence to the input signal. Alternatively, the processor may perform a control such that the second part 502 of the tension transmitting member 500 is disposed in parallel to the first part 501 by rotating (e.g., in the counterclockwise direction) the drum 410, when a request for execution of a specific application (e.g., an application configured to output a screen in both of the fixed exposure area 161 and the expandable exposure area 162) is made. In a state, in which the rollable electronic device 100 is closed, the second part 502 of the tension transmitting member 500 may be located on the same plane (or the same plane as the first part 501 of the tension transmitting member 500) as an end (e.g., an end of the −x axis periphery) of the display structure 160. Alternatively, when the state of the rollable electronic device 100 is changed from the close state to the open state, the state may be changed such that one surface (e.g., an upper surface) of the second part 502 of the tension transmitting member 500 faces in correspondence to counterclockwise rotation of the drum 410 in the state, in which the one surface faces the z axis direction.

In consideration of the disposition of the member hole 511 and the boss 419 formed in the drum 410, when a structure, in which a size of the member hole 511 is formed to be larger than a size of the boss of the drum 410, is viewed in the −z axis direction from the z axis, the boss 419 of the drum 410 may be disposed to be biased in the x axis direction of the member hole 511 formed at a portion (e.g., 503) of the tension transmitting member 500, which is located in the z axis direction when the state of the rollable electronic device 100 is changed from the open state to the close state or in the close state, and the boss 419 of the drum 410 may be disposed to be biased in the −x axis direction of the member hole 511 formed at a portion (e.g., 502) of the tension transmitting member 500, which is located in the z axis direction with reference to observation in the −z axis direction from the z axis when the state of the rollable electronic device 100 is changed from the close state to the open state or is in the open state. Furthermore, when the state is changed from the open state to the close state or is the close state, the boss 419 of the drum 410 may contact a side surface of a peripheral portion that defines the member hole 511 formed in the second part 502, with reference to observation in the −z axis direction from the z axis direction, in the x axis direction, and when the state is changed from the close state to the open state or is the open state, the boss 419 of the drum 410 may contract a side surface of a peripheral portion that defines the member hole 511 formed in the third part 503 with reference to observation in the −z axis direction from the z axis direction, in the −x axis direction.

While the state of the rollable electronic device 100 is changed from the open state to the close state, the drum 410 may be rotated in the clockwise direction with respect to the illustrated drawings. As the drum 410 is rotated (e.g., rotated in the clockwise direction), the tension transmitting member 500 fixed to the first member fixing part 371 of the display structure 160 may generate a tension that pulls the display structure 160 in the −x axis direction. When the display structure 160 is pulled in the −x axis direction, a state of the expandable exposure area 162 of the display structure 160 may be changed from a state (e.g., an exposure state), in which it is disposed to face the z axis direction, to a state (a non-exposure state), in which it is disposed to face the −z axis direction. In correspondence, the second part 502 of the tension transmitting member 500 disposed to face the −z axis direction may be disposed such that one surface thereof faces the z axis direction while being wound as the drum 410 is rotated in the clockwise direction.

While the state of the rollable electronic device 100 is changed from the open state to the close state, the movable pulley 321 may be moved in the −x axis direction. While the state of the rollable electronic device 100 is changed from the close state to the open state, the movable pulley 321 may be moved in the x axis direction.

As described above, according to the rollable electronic device 100 according to an embodiment, a tension is consistently transmitted to the curved surface of the display structure 160 since the tension transmitting member 500 directly pulls the display structure 160 while the open state is changed to the close state, whereby as illustrated above in FIG. 3C, the state may be changed while a perfect curved surface is maintained without any distortion or twisting of the curved part, which may occur when the display area of the display structure 160 is closed by using the second housing 320. Furthermore, according to the rollable electronic device 100, since the tension transmitting member 500 directly pushes the second housing 320 in the x axis direction while the close state is changed to the open state, the x axis periphery of the second housing 320 pushes out the support structure 180 of the display structure 160. Accordingly, as illustrated in FIG. 5C, which has been described above, distortion or twisting (or buckling) of the curved part 550 that may occur when the display area of the display structure 160 is opened by directly pushing the display structure 160 may be alleviated, and the display area may be opened while a perfect curved surface is maintained. Since the boss 419 of the drum 410 pushes the side surface 602 of the member hole 511 formed in the third part 503, in the −x axis direction, with reference to observation in the −z axis direction from the z axis while the second housing 320 is moved in the x axis direction and the state of the rollable electronic device 100 is changed from the close state to the open state, a separate tension may not be formed (or the tension may be 0) in the tension transmitting member part (e.g., the first part 501 and the second part 502) between the first member fixing part 371 of the display structure 160 and the drum 410. Since the boss 419 of the drum 410 pushes the side surface 601 of the member hole 511 formed in the second part 502, in the x axis direction, with reference to observation in the −z axis direction from the z axis while the state of the rollable electronic device 100 is changed from the open state to the close state, a separate tension may not be formed (or the tension may be 0) in the second to fourth parts 502 to 504, the fixed pulley 311, and the movable pulley 321 while the display area of the display structure 160 is closed.

As in FIG. 13B, the sliding driving part needs to generate a driving force for directly pulling the second housing 320 and other components when the display area of the display 160a is closed by using the second housing 320 (or an SET) and the rail part 225a. In this case, when a force that is applied to a structure for directly pulling the display structure 160 is denoted by F, 2F may be required for a driving force that drives the SET. Alternatively, as a distance, by which the display structure 160 is moved, becomes two times as large as a distance, by which the second housing 320 is moved, the force that directly pulls the display structure 160 may become a half of the force that pulls the SET. In this way, the rollable electronic device 100 that supports the rollable motion using the tension transmitting member may help decrease the driving force that is necessary for sliding of the display structure 160 and secure a durability of a life span of the display structure 160, in a structure, in which the exposure area of the display structure 160 is repeatedly opened and closed. Furthermore, the rollable electronic device 100 according to an embodiment may decrease separation (or delamination) of the layers (e.g., the layers of the display 160a or the layers of the support structure 180) of the display structure 160 while the display structure 160 is slid, by decreasing a resistant force that is necessary for driving the device, and may increase an efficiency of the disposition space of the sliding driving part 400 (e.g., the motor). Furthermore, the rollable electronic device 100 according to an embodiment may support independent driving without any mutual interference when the state is changed, by implementing the driving by using a tensile force of the tension transmitting member in the open state and the close state. The independent driving force transmitting scheme may provide a further improved driving performance since a separation sink (e.g., matching of gear teeth while the open state is changed to the close state or the close state is changed to the open state when gears are used) in the open state and the close state, and may provide an excellent function in designing a product since adjustment according to a change of the length due to size deviation of the mechanism and the slip of the display structure 160 may not be considered as compared with use of a plurality of gears (e.g., use of rack gears).

The rollable electronic device 100 according to an embodiment may implement a double effect of the thrust of the motor by using the movable pulley 321 (or a movement pulley) while using the first tension transmitting member 531 that drives the second housing 320 when the close state is changed to the open state, and maintain a higher configuration performance by directly pulling an end of the display structure 160 when the state is changed to the close state. Through this, the rollable electronic device 100 of the structure mentioned in FIG. 13B may support the display 160a be operated only by a driving force of one time or more of the driving resistant force in a condition, in which a driving force of two times or more of the driving resistant force of the display 160a has to be implemented. For example, the rollable electronic device 100 may double the driving force of the motor through the movable pulley 321 fixed to the second housing 320 and the fixed pulley 311 fixed to the first housing 310 since it transmits the driving force by using the tension transmitting member. As described above, since the rollable electronic device 100 according to an embodiment directly pulls the display 160a that requires the highest driving resistant force in the sliding operation when the state is changed to the close state, it may decrease the total driving resistance force of the rollable electronic device 100 by about 45% (may provide an efficiency that is theoretically 50%, and lower by 50% due to additional consumption of frictions), whereby the driving in a low-temperature state may be supported. Through this, according to the rollable electronic device 100, an increase of the thickness of the device and an increase of the motor disposition space due to an increase of the size of the motor may be alleviated, power consumptions that are necessary for the driving may be reduced, and a battery capacity problem may be alleviated, since the thrust of the motor may be designed without considering a low-temperature environment. Furthermore, according to the rollable electronic device 100, as compared with a structure, in which the sliding driving part 400 is disposed in the second housing 320 and then is connected to the printed circuit board disposed in the first housing 310, the sliding driving part 400 is disposed in the first housing 310, whereby material costs may be reduced and a high efficiency of a hardware disposition space may be achieved by further simplifying a connection structure that connects the printed circuit boards and the sliding driving part 400.

Figure 14:
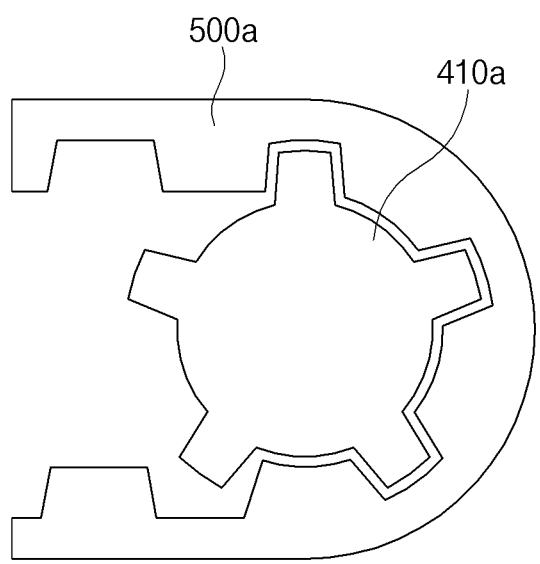
FIG. 14 is a cross-sectional view illustrating an example of a fourth type sliding driving part according to an embodiment.

FIG. 14 is a view illustrating another example of some configurations of a fourth type sliding driving part according to an embodiment.

Referring to FIG. 14, a tension transmitting member 500a may have a convexo-concave shape that is recessed inwards as illustrated, and a drum 410a may have a gear structure that has bosses that are engaged with the convexo-concave shape of the tension transmitting member 500a.

The drum 410a may have the same structure and material as those of the drum 410 described above with reference to FIGS. 11 to 13A. The drum 410a, for example, may be rotated in one direction (e.g., the clockwise direction or the counterclockwise direction) by the power generated by the power part 403. The bosses formed in the drum 410a may have a size and a height corresponding to those of engraved portions of the convexo-concave part formed in the tension transmitting member 500a. Although five bosses are provided in the drum 410a in the illustrated drawing, the present embodiment is not limited thereto, and the number of bosses may be differently determined according to the convexo-concave structure (e.g., a groove or a recess) formed on an inner side of the tension transmitting member 500a. For example, the number of the bosses of the drum 410a may be six or more or four or less.

An outer surface of the tension transmitting member 500a may be formed to be flat, and at least a portion of an inner surface thereof, which contacts the drum 410a, may have a convexo-concave pattern. As described above in FIG. 13A, when the rollable electronic device 100 is in the open or close state, at least a portion of the entire tension transmitting member 500a may contact the drum 410a. In correspondence, the convexo-concave pattern may be formed on the entire inner surface of the tension transmitting member 500a, and may be formed at a portion (e.g., a portion thereof, which contacts the drum 410a when the state is changed to the open state or the close state) of the entire tension transmitting member 500a. The tension transmitting member 500a may be formed of various materials. As an example, the tension transmitting member 500a may have a material, which has a relatively low elasticity and an excellent wear-resistant property, and a shape (e.g., a rope or a wire formed of a fiber material, or a mixture of various materials, or a folded yarn structure, in which a plurality of strings are combined). Furthermore, when a central portion of the tension transmitting member 500*a* is formed of a metallic material and an outer surface thereof is formed of a nonmetallic material, a structure that has a convexo-concave pattern in some layers while a structure having a convexo-concave pattern of a nonmetallic material on an inner surface thereof is formed or layers having a plurality of materials are stacked may be formed. The convexo-concave pattern formed on the inner surface of the tension transmitting member 500*a* may vary in correspondence to the sizes of the bosses formed in the drum 410*a*, the intervals of the bosses, and the heights of the bosses.

The structures of the tension transmitting member 500*a* and the drum 410*a* described above in FIG. 14 may replace the structure that includes the member hole 511 described in the rollable electronic device 100 described above in FIGS. 11 to 13A.

Figure 15:
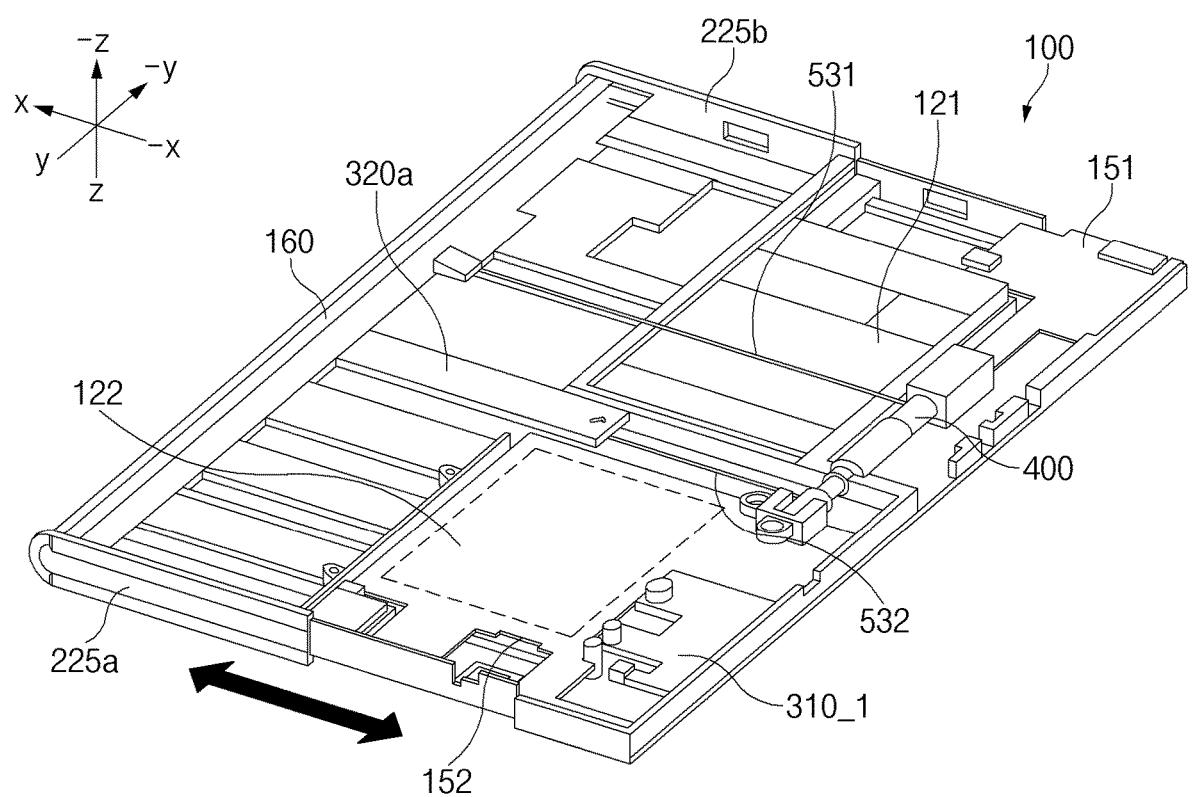
FIG. 15 is a perspective view illustrating another example of a first housing and a second housing according to an embodiment.

FIG. 15 is a view illustrating another example of the first housing and the second housing according to an embodiment.

Referring to FIG. 15, the rollable electronic device according to an embodiment may include a first housing 310_1, a second housing 320_1, the sliding driving part 400, the first tension transmitting member 531, the second tension transmitting member 532, the display structure 160, the first printed circuit board 151, the second printed circuit board 152, the first battery 121, and the second battery 122.

The first housing 310_1 may function to support at least a portion of the second housing 320_1 while the second housing 320_1 is slid in a state, in which at least a portion of the second housing 320_1 is seated. The sliding driving part 400 may be fixed to one side (e.g., the −x axis periphery) of the first housing 310_1. The first printed circuit board 151 and the second printed circuit board 152 may be seated on one side of the first housing 310_1. Seating areas, in which the first battery 121 and the second battery 122 may be disposed, respectively, may be disposed in the first housing 310_1. At least one surface of the first housing 310_1 in the z axis direction may support a portion (e.g., a fixed exposure area) of the display structure 160.

The second housing 320 may be seated on one side of the first housing 310_1, and be moved in the x axis direction or the −x axis direction according to control of the sliding driving part 400. One side of the second housing 320_1 may function to push the display structure 160 in the x axis direction while supporting at least a portion thereof when the display area (or the exposure area) of the display structure 160 is expanded while the one side of the second housing 320_1 faces or contacts a portion of the display structure 160. The rail parts 225*a* and 225*b* that guide y axis and −y axis peripheries of the display structure 160 may be disposed at y axis and −y axis peripheries of the second housing 320_1. At least a portion of the second housing 320_1 may be fixed to the second tension transmitting member 532. A structure, in which the second housing 320_1 and the second tension transmitting member 532 are connected to each other, may include a connection structure through the movable pulley described above in FIGS. 4A to 14.

The sliding driving part 400 may be any one of the first to fourth types described above in FIGS. 1 to 14. As an example, the sliding driving part 400 may be connected to the first tension transmitting member 531 and the second tension transmitting member 532. The sliding driving part 400, for example, may control operations of winding or unwinding the first tension transmitting member 531 and the second tension transmitting member 532 in correspondence to control of the processor disposed in at least one of the first printed circuit board 151 or the second printed circuit board 152. At least one of the first printed circuit board 151 and the second printed circuit board 152 may be the main printed circuit board described above in FIGS. 1 to 3.

The first tension transmitting member 531 may include a part that is connected to one side of the drum formed in the sliding driving part 400, and a part that is connected to one side of the display structure 160. The second tension transmitting member 532 may drive the second housing 320_1 through the movable pulley provided in the second housing 320_1, the fixed pulley 311 provided in the first housing 310_1, and the tension fixing part 350*b* provided in the first housing 310_1. The first tension transmitting member 531 may be directly connected to the display structure 160, and may control the close state of the display structure 160 according to the pulling tension (e.g., a tensile force) that occurs due to the operation of winding the sliding driving part 400. Since the second tension transmitting member 532 is connected to the second housing 320_1 through the movable pulley 321 and the fixed pulley 311, the second housing 320_1 may be driven in the x axis direction by using an operation (e.g., a tension) of winding the second tension transmitting member 532 of the sliding driving part 400.

The first battery 121 and the second battery 122 may be fixed onto the first housing 310_1 while the second housing 320_1 is slid in the x axis direction or the −x axis direction. The first battery 121 may have a size that is larger than that of the second battery 122.

Figure 16:
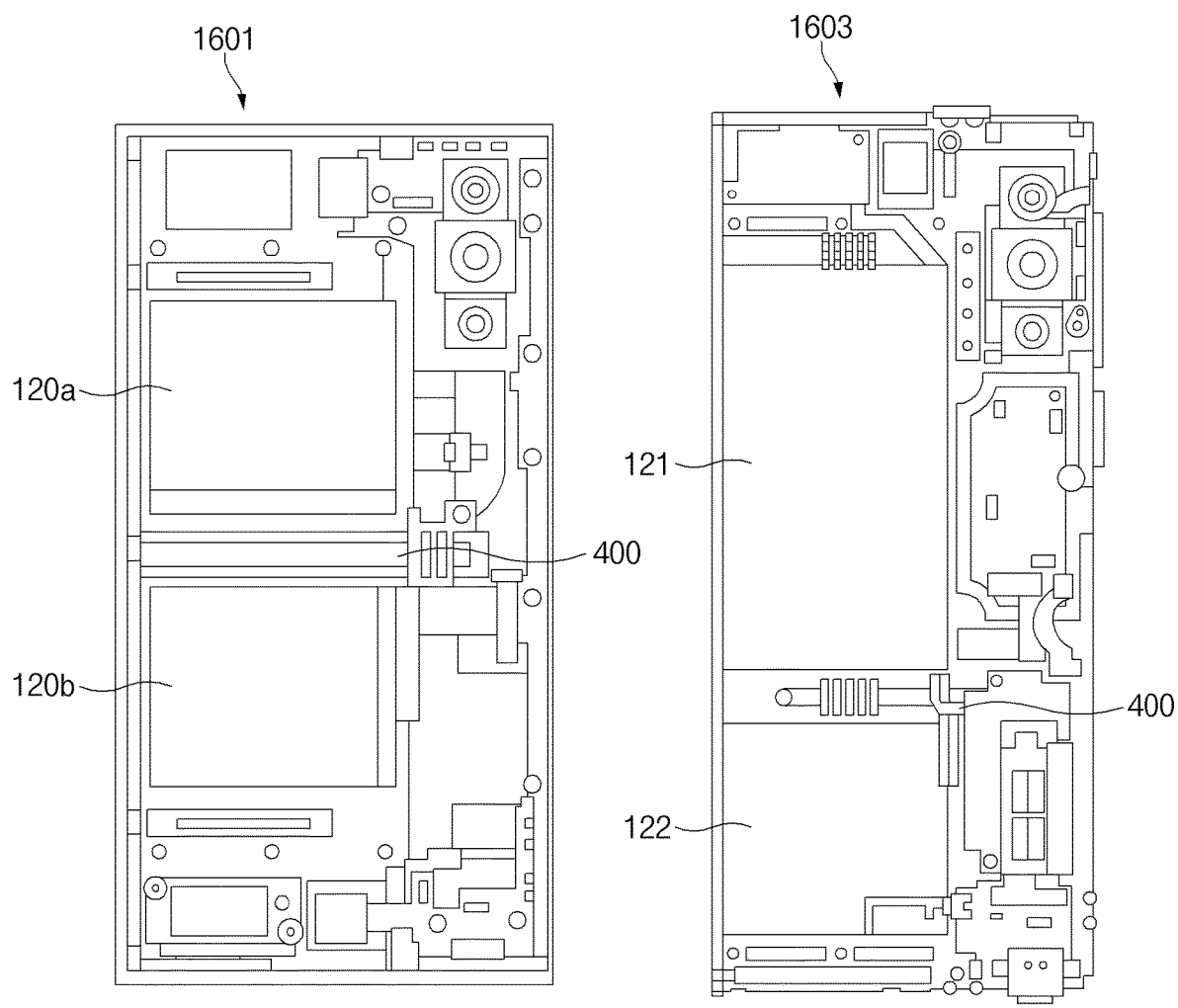
FIG. 16 is a plan view illustrating an example of a battery disposition structure according to an embodiment.

FIG. 16 is a view illustrating an example of a battery disposition structure according to an embodiment.

Referring to FIG. 16, in the rollable electronic device according to an embodiment, as in state 1601, a first battery 120*a* and a second battery 120*b* may have the same size. Furthermore, in the rollable electronic device, as in 1603, the first battery 121 and the second battery 122 may have different sizes.

An eccentricity of a driving body is for an efficiency of disposition of hardware, and as an example, is for securing a capacity of a battery. In a rollable electronic device, to which a basic rack and pinion driving body is applied, a separated battery may need to be applied for disposition of the battery. Even when a total volume of two batteries is the same, efficiency becomes higher as a volume of one battery becomes larger, and thus the batteries 121 and 122 having different volumes as in state 1603 may need to be applied.

For example, since a tensioning operation for driving the fixed pulley 311, the movable pulley 321, and the second housing 320 in the x axis direction, which has been described above in FIGS. 6A and 6B, is required when the rollable electronic device 100 is driven from the close state to the open state, the opening operation may be supported without any distortion or twisting of the display structure 160 by driving the second housing 320 in the x axis direction and thus pushing the entire display structure 160 by the x axis periphery of the second housing 320 even though an eccentricity occurs for avoidance of the batteries in a condition, in which a plurality of batteries are applied. Additionally, in relation to movement of the second housing 320, an influence of the eccentricity may be alleviated by applying a guide structure (e.g., an LM guide) that minimizes a gap, by which the second housing 320 may be mechanically moved in parallel.

When the rollable electronic device 100 is driven from the open state to the close state, the display structure 160 may be damaged due to tilting during the above-mentioned repeated driving when it is directly driven while the display structure 160 is eccentric. In various embodiments, since the tension transmitting members 531, 532, 530, and 500 are connected to a y axis central point of the display structure 160 so that the display structure 160 is pulled, the display structure 160 may be pulled regardless of the structures and the number of the batteries, and a closing operation of the display structure 160 may be driven without any side effect or eccentricity, such as degradation of the capacities of the batteries or an increase in the thickness of the SET (device). For example, as in state 1603, biasing or distortion of the display structure 160 may be restrained by making the driving structure of the rollable electronic device 100 eccentric and disposing an operation point that delivers the driving force at a central portion of the display structure 160, whereby damage due to stresses of the display structure 160 may be reduced. A force that uniformly pushes the display structure 160 is transmitted by the second housing 320 or 320a while the state is changed from the close state to the open state, and the tension transmitting member pulls the center of weight of the display structure 160 when the state is changed to the close state, whereby damage to the display due to the tilting may be restrained.

Meanwhile, the above-described embodiments in FIGS. 1 to 16 may be independently described or may be applied to other embodiments. For example, the structure, in which the plurality of batteries have the same size, or the structure, in which the plurality of batteries have different sizes, also may be applied to the various sliding driving parts described above, and the structure, in which the tension transmitting member (e.g., the second tension transmitting member 532) is connected to the center (or the center of weight) of a periphery of one side of the display structure 160, also may be applied to at least one of various rollable electronic devices mentioned in FIGS. 4A to 16. Furthermore, the structure that has been mentioned in FIGS. 7A and 7B, in which the groove is formed on an inner side of the tension transmitting member, the structure, in which the bosses are formed on one side of the drum, or the structure, in which the guide grooves are formed in the drum, also may be applied to other embodiments.

In the description of the above-described embodiment, a rope, a wire, or a belt has been mentioned as a configuration of the tension transmitting member, but the disclosure is not limited thereto. For example, the tension transmitting member of the belt type mentioned in FIG. 11 may be replaced by a chain. When the chain is applied as the tension transmitting member, the drum 410 may have a structure that includes a gear and a shaft formed at a center of the gear.

According to an aspect of the disclosure, a rollable electronic device includes a display structure, a first housing that supports a fixed exposure area of the display structure, a second housing that supports at least a portion of an expandable exposure area extending from the fixed exposure area of the display structure, a sliding driving part disposed in the first housing, and that controls opening and closing of the exposure area of the display structure, and a first tension transmitting member connected to one side of the display structure and one side of the sliding driving part, and a second tension transmitting member, one side of which is fixed to the first housing and an opposite side of which is connected to the sliding driving part after being held at a portion of the second housing, and the sliding driving part includes a first drum for an operation of winding and unwinding the first tension transmitting member, a second drum for an operation of winding and unwinding the second tension transmitting member, a motor that operates the first drum and the second drum in a first direction or a second direction that is opposite to the first direction, and at least one reduction gear that reduces a speed of the motor.

According to an aspect of the disclosure, a rollable electronic device includes a display structure including a fixed exposure area which is fixedly exposed to outside the rollable electronic display device, and an expandable exposure area which extends from the fixed exposure area, a first housing which is fixed to the display structure and corresponds to the fixed exposure area of the display structure, a second housing which is slidably disposed with the first housing, corresponds to the expandable exposure area of the display structure and along which the expandable exposure area of the display structure is slidable, a sliding driver which is disposed in the first housing and controls an opening operation and a closing operation of the rollable electronic device, and a tension transmitting member which is windable at the sliding driver, the tension transmitting member including a first end which is fixedly connected to the display structure and a second end which is fixedly connected the first housing. The opening operation includes the second housing sliding away from the first housing and expanding the expandable exposure area, the closing operation includes the second housing sliding toward the first housing and contracting the expandable exposure area, in the opening operation, the sliding driver winds the first end of the tension transmitting member, in a first rotational direction, and in the closing operation, the sliding driver winds the second end of the tension transmitting member, in a second rotational direction.

According to various embodiments, the sliding driving part may include a drum that performs the operation of winding the tension transmitting member, and a motor that rotates the drum.

According to various embodiments, the sliding driving part may further include a reduction gear that reduces a speed of the motor and connected to the drum.

According to various embodiments, the tension transmitting member may include member holes disposed at a specific interval, and the drum may include a plurality of bosses coupled to the member holes.

According to various embodiments, the second housing may include a movable pulley rotatably connected with the second portion of the tension transmitting member. The first housing may include a fixed pulley rotatably connected with the tension transmitting member, and a tension fixer which is adjacent to the fixed pulley and to which the second end of the tension transmitting member is fixedly connected.

According to various embodiments, the display structure may include an area supported by the first housing, and a changeable area, a disposition state of which is changed according to a slide operation of the second housing, and the changeable area may include a plurality of multi-bars.

According to an aspect of the disclosure, a rollable electronic device includes a display structure including a fixed exposure area which is fixedly exposed to outside the rollable electronic display device, and an expandable exposure area which extends from the fixed exposure area, a first housing which is fixed to the display structure and corresponds to the fixed exposure area of the display structure, a second housing which is slidably disposed to the first housing, corresponds to the expandable exposure area of the display structure and along which the expandable exposure area of the display structure is slidable, a sliding driver which is fixedly disposed in the first housing and controls an opening operation and a closing operation of the rollable electronic device, a first tension transmitting member fixedly connected to the display structure and rotatably connected to the sliding driver, and a second tension transmitting member rotatably connected to the second housing, the first housing and the sliding driver.

According to various embodiments, the rollable electronic device may further include a fixed pulley about which the second tension transmitting member is rotatably connected to the first housing, and a tension fixer which is adjacent to the fixed pulley, disposed in the first housing, and a movable pulley about which the second tension transmitting member is rotatably connected to the second housing, disposed in the second housing. One end of the second tension transmitting member is fixed to the sliding driver, an opposite end of the second tension transmitting member is fixed to the tension fixer, and a portion of the second tension transmitting member which is between the one end and the opposite end extends along the fixed pulley and the movable pulley.

According to various embodiments, the sliding driving part may include a first motor that drives the first tension transmitting member, a first drum for an operation of winding or unwinding the first tension transmitting member, a second motor that drives the second tension transmitting member, and a second drum for an operation of winding or unwinding the second tension transmitting member.

According to various embodiments, the rollable electronic device may further include a first reduction gear that reduces a speed of the first motor, and a second reduction gear that reduces a speed of the second motor.

According to various embodiments, within the closing operation, the second tension transmitting member may be unwound from the second drum in a counterclockwise direction together with the first tension transmitting member being wound on the first drum in a clockwise direction.

According to various embodiments, the opening operation may include the second housing sliding away from the first housing in a second direction, and expanding the expandable exposure area, and within the opening operation, the first tension transmitting member may be unwound from the first drum in a clockwise direction, together with the second tension transmitting member being wound on the second drum in the clockwise direction.

According to various embodiments, the first drum and the second drum may include spiral guide grooves, on which the first tension transmitting member and the second tension transmitting member are seated.

According to various embodiments, the sliding driving part may include an integrated drum, to which the first tension transmitting member and the second tension transmitting member are commonly connected, and at least one motor that drives the integrated drum.

According to various embodiments, the first tension transmitting member may pull the display structure in a first direction while the integrated drum is rotated in a clockwise direction, and the second tension transmitting member may push the second housing in a second direction that is opposite to the first direction while the integrated drum is rotated in a counterclockwise direction.

According to various embodiments, the first tension transmitting member and the second tension transmitting member may be connected to each other on one side of the integrated drum.

According to various embodiments, the integrated drum may include spiral guide grooves, on which the first tension transmitting member and the second tension transmitting member are seated.

According to various embodiments, the rollable electronic device may further include a first battery and a second battery disposed on one side of the second housing or the first housing, where the first battery is larger than the second battery.

According to various embodiments, the second tension transmitting member may be connected to a center weight of a periphery of one side of the display structure.

According to an aspect of the disclosure, a rollable electronic device includes a display structure including a display area, a first housing corresponding to the display structure, a second housing corresponding to the display structure, and slidably disposed with respect to the first housing and the display structure, a sliding driver which controls expansion or contraction of the display area of the display structure, by controlling sliding of the display structure with respect to the second housing and sliding of the second housing with respect to both the first housing and the display structure, and a tension transmitting member including one end of which is fixedly connected to the display structure, an opposite end which is fixedly connected to the first housing, a portion which is between the one end and the opposite end and is rotatably connected to the second housing, and a hole defined in the tension transmitting member. The sliding driver includes a drum which is rotatable and includes a boss coupled to the hole of the tension transmitting member, and a motor which controls rotation of the drum. The motor rotates in a clockwise direction to contract the display area of the display structure, and the motor rotates in a counterclockwise direction to expand the display area of the display structure.

Figure 17:
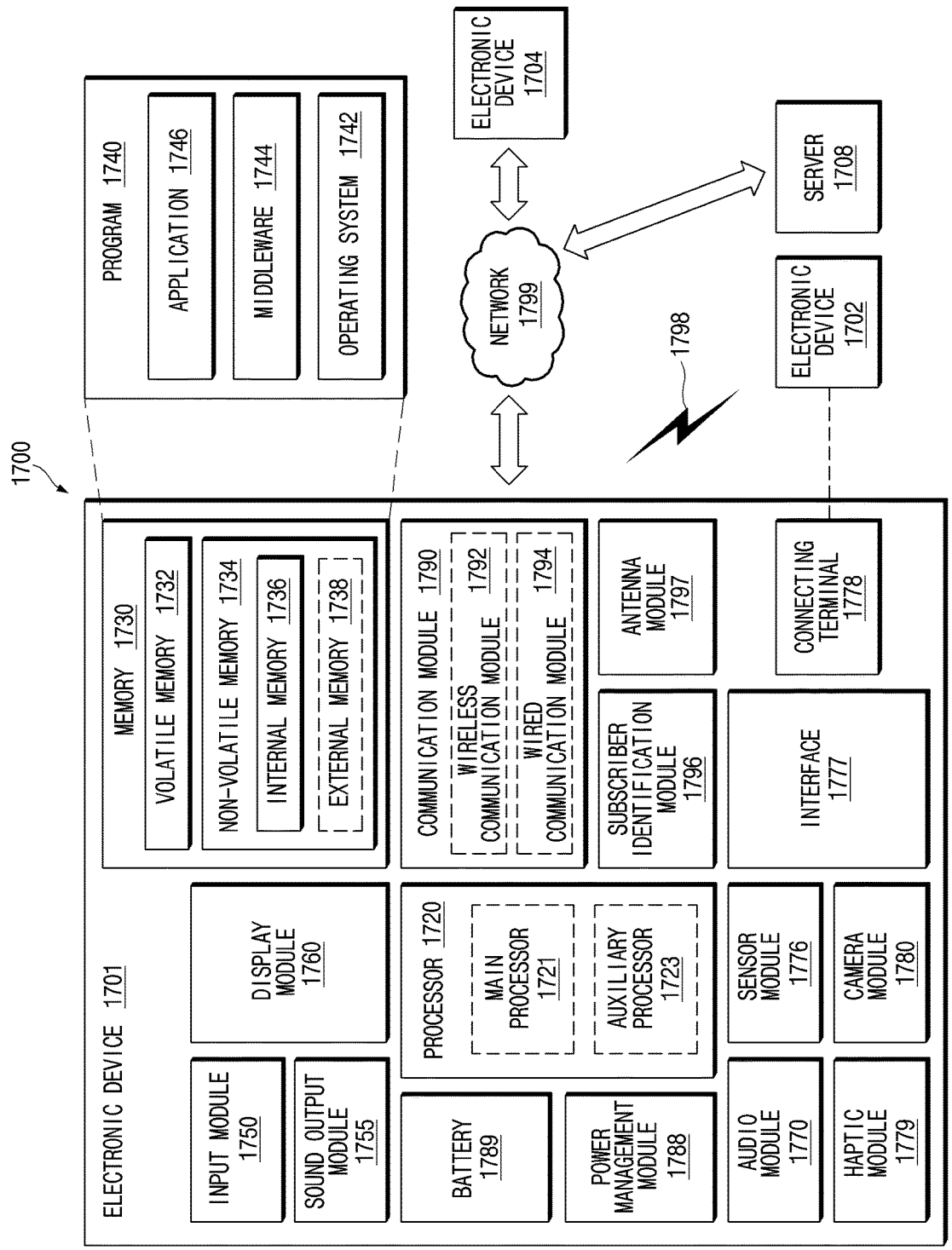
FIG. 17 is a block diagram of an electronic device in a network environment according to various embodiments.

FIG. 17 is a block diagram illustrating an electronic device 1701 in a network environment 1700 according to various embodiments. Referring to FIG. 17, the electronic device 1701 in the network environment 1700 may communicate with an electronic device 1702 via a first network 1798 (e.g., a short-range wireless communication network), or at least one of an electronic device 1704 or a server 1708 via a second network 1799 (e.g., a long-range wireless communication network). According to an embodiment, the electronic device 1701 may communicate with the electronic device 1704 via the server 1708. According to an embodiment, the electronic device 1701 may include a processor 1720, a memory 1730, an input module 1750, a sound output module 1755, a display module 1760, an audio module 1770, a sensor module 1776, an interface 1777, a connecting terminal 1778, a haptic module 1779, a camera module 1780, a power management module 1788, a battery 1789, a communication module 1790, a subscriber identification module (SIM) 1796, or an antenna module 1797. In some embodiments, at least one (e.g., the connecting terminal 1778) of the components may be omitted from the electronic device 1701, or one or more other components may be added in the electronic device 1701. In some embodiments, some of the components may be implemented as single integrated circuitry. For example, some (e.g., the sensor module 1776, the camera module 1780, or the antenna module 1797) of the components may be implemented as embedded in the display module 1760 (e.g., a display).

The processor 1720 may execute, for example, software (e.g., a program 1740) to control at least one other component (e.g., a hardware or software component) of the electronic device 1701 coupled with the processor 1720, and may perform various data processing or computation. According to one embodiment, as at least part of the data processing or computation, the processor 1720 may load a command or data received from another component (e.g., the sensor module 1776 or the communication module 1790) in a volatile memory 1732, process the command or the data stored in the volatile memory 1732, and store resulting data in a non-volatile memory 1734. According to an embodiment, the processor 1720 may include a main processor 1721 (e.g., a central processing unit (CPU) or an application processor (AP)), and an auxiliary processor 1723 (e.g., a graphics processing unit (GPU), a neural processing unit (NPU), an image signal processor (ISP), a sensor hub processor, or a communication processor (CP)) that is operable independently from, or in conjunction with, the main processor 1721. When the electronic device 1701 includes the main processor 1721 and the auxiliary processor, the auxiliary processor 1723 may be adapted to consume less power than the main processor 1721, or to be specific to a specified function. The auxiliary processor 1723 may be implemented as separate from, or as part of the main processor 1721.

The auxiliary processor 1723 may control at least some of functions or states related to at least one component (e.g., the display module 1760, the sensor module 1776, or the communication module 1790) among the components of the electronic device 1701, instead of the main processor 1721 while the main processor 1721 is in an inactive (e.g., sleep) state, or together with the main processor 1721 while the main processor 1721 is in an active state (e.g., executing an application). According to an embodiment, the auxiliary processor 1723 (e.g., an image signal processor or a communication processor) may be implemented as part of another component (e.g., the camera module 1780 or the communication module 1790) functionally related to the auxiliary processor 1723. According to an embodiment, the auxiliary processor 1723 (e.g., a neural network processing device) may include a hardware structure that is specific to process of an artificial intelligence model. The intelligence model may be generated through machine learning. The learning, for example, may be performed by the electronic device 1701 itself, in which the artificial intelligence module is performed, and may be performed by a separate server (e.g., the server 1708). The learning algorithm, for example, may include supervised learning, unsupervised learning, semi-supervised learning, or reinforcement learning, but is not limited to the above-described examples. The intelligence model may include a plurality of intelligence neural network layers. The artificial neural network may be a deep neural network, a convolutional neural network (CNN), a recurrent neural network (RNN), a restricted Boltzmann machine (RBM), a deep belief network (DBM), a bidirectional recurrent deep neural network (BRDNN), deep Q-networks, or one of combinations thereof, but is not limited to the above-described examples. The artificial intelligence model may include, additionally or alternatively, a software structure, in addition to the hardware structure.

The memory 1730 may store various data used by at least one component (e.g., the processor 1720 or the sensor module 1776) of the electronic device 1701. The various data may include, for example, software (e.g., the program 1740) and input data or output data for a command related thereto. The memory 1730 may include the volatile memory 1732 or the non-volatile memory 1734.

The program 1740 may be stored in the memory 1730 as software, and may include, for example, an operating system (OS) 1742, middleware 1744, or an application 1746.

The input module 1750 may receive a command or data to be used by other component (e.g., the processor 1720) of the electronic device 1701, from the outside (e.g., a user) of the electronic device 1701. The input module 1750 may include, for example, a microphone, a mouse, a keyboard, a key (e.g., a button), or a digital pen (e.g., a stylus pen).

The sound output module 1755 may output sound signals to the outside of the electronic device 1701. The sound output module 1755 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display module 1760 may visually provide information to the outside (e.g., a user) of the electronic device 1701. The display module 1760 may include, for example, a display, a hologram device, or a projector and control circuitry to control a corresponding one of the display, hologram device, and projector. According to an embodiment, the display module 1760 may include touch sensor adapted to detect a touch, or a pressure sensor adapted to measure the intensity of force incurred by the touch.

The audio module 1770 may convert a sound into an electrical signal and vice versa. According to an embodiment, the audio module 1770 may obtain the sound via the input module 1750, or output the sound via the sound output module 1755 or an external electronic device (e.g., the electronic device 1702) (e.g., speaker of headphone) directly (e.g., wiredly) or wirelessly coupled with the electronic device 1701.

The sensor module 1776 may detect an operational state (e.g., power or temperature) of the electronic device 1701 or an environmental state (e.g., a state of a user) external to the electronic device 1701, and then generate an electrical signal or data value corresponding to the detected state. According to an embodiment, the sensor module 1776 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1777 may support one or more specified protocols to be used for the electronic device 1701 to be coupled with the external electronic device (e.g., the electronic device 1702) directly (e.g., wiredly) or wirelessly. According to an embodiment, the interface 1777 may include, for example, a high definition multimedia interface (HDMI), a universal serial bus (USB) interface, a secure digital (SD) card interface, or an audio interface.

A connecting terminal 1778 may include a connector via which the electronic device 1701 may be physically connected with the external electronic device (e.g., the electronic device 1702). According to an embodiment, the connecting terminal 1778 may include, for example, a HDMI connector, a USB connector, a SD card connector, or an audio connector (e.g., a headphone connector).

The haptic module 1779 may convert an electrical signal into a mechanical stimulus (e.g., a vibration or a movement) or electrical stimulus which may be recognized by a user via his tactile sensation or kinesthetic sensation. According to an embodiment, the haptic module 1779 may include, for example, a motor, a piezoelectric element, or an electric stimulator.

The camera module 1780 may capture a still image or moving images. According to an embodiment, the camera module 1780 may include one or more lenses, image sensors, image signal processors, or flashes.

The power management module 1788 may manage power supplied to the electronic device 1701. According to one embodiment, the power management module 1788 may be implemented as at least part of, for example, a power management integrated circuit (PMIC).

The battery 1789 may supply power to at least one component of the electronic device 1701. According to an embodiment, the battery 1789 may include, for example, a primary cell which is not rechargeable, a secondary cell which is rechargeable, or a fuel cell.

The communication module 1790 may support establishing a direct (e.g., wired) communication channel or a wireless communication channel between the electronic device 1701 and the external electronic device (e.g., the electronic device 1702, the electronic device 1704, or the server 1708) and performing communication via the established communication channel. The communication module 1790 may include one or more communication processors that are operable independently from the processor 1720 (e.g., the application processor (AP)) and supports a direct (e.g., wired) communication or a wireless communication. According to an embodiment, the communication module 1790 may include a wireless communication module 1792 (e.g., a cellular communication module, a short-range wireless communication module, or a global navigation satellite system (GNSS) communication module) or a wired communication module 1794 (e.g., a local area network (LAN) communication module or a power line communication (PLC) module). A corresponding one of these communication modules may communicate with the external electronic device via the first network 1798 (e.g., a short-range communication network, such as Bluetooth™, wireless-fidelity (Wi-Fi) direct, or infrared data association (IrDA)) or the second network 1799 (e.g., a long-range communication network, such as a legacy cellular network, 5G network, next generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1792 may identify or authenticate the electronic device 1701 in a communication network, such as the first network 1798 or the second network 1799, using subscriber information (e.g., international mobile subscriber identity (IMSI)) stored in the subscriber identification module 1796.

The wireless communication module 1792 may support 5G networks and next-generation communication technologies after the 4G networks, for example, a new radio (NR) access technologies. The NR access technologies may support an enhanced mobile broadband (eMBB), massive machine type communications (mMTCs), or ultra-reliable and low-latency communications (URLLCs). The wireless communication module 1792, for example, may support a high-frequency band (e.g., a mmWave band) to achieve a high data transmission rate. The wireless communication module 1792 may support various technologies for securing performance in a high-frequency band, for example, technologies, such as beamforming, massive multiple-input and multiple-output (MIMO), full dimensional (FD-MIMO), array antenna, analog beam-forming, or a large scale antenna. The wireless communication module 1792 may support various requirements ruled in the electronic device 1701, an external electronic device (e.g., the electronic device 1704), or a network system (e.g., the second network 1799). According to an embodiment, the wireless communication module 1792 may support a peak data rate (e.g., 20 Gbps or more) for realizing an eMBB, a loss coverage (e.g., 164 dB or less) for realizing a mMTC, a U-plane latency (e.g., a downlink (DL) and an uplink (UL) of 0.5 ms or less, or a round trip of 1 ms or less) for realizing a URLLC.

The antenna module 1797 may transmit or receive a signal or power to or from the outside (e.g., the external electronic device) of the electronic device 1701. According to an embodiment, the antenna module 1797 may include an antenna including a radiating element composed of a conductive material or a conductive pattern formed in or on a substrate (e.g., PCB). According to an embodiment, the antenna module 1797 may include a plurality of antennas (e.g., an array antenna). In such a case, at least one antenna appropriate for a communication scheme used in the communication network, such as the first network 1798 or the second network 1799, may be selected, for example, by the communication module 1790 from the plurality of antennas. The signal or the power may then be transmitted or received between the communication module 1790 and the external electronic device via the selected at least one antenna. According to an embodiment, another component (e.g., a radio frequency integrated circuit (RFIC)) other than the radiating element may be additionally formed as part of the antenna module 1797.

According to various embodiments, the antenna module 1797 may be a mmWave antenna module. According to an embodiment, the mmWave antenna module may include a printed circuit board, an RFIC that may support that is disposed on a first surface (e.g., an undersurface thereof) of the printed circuit board or to be adjacent thereto to support a specific high-frequency band (e.g., a mmWave band), and a plurality of antennas that is disposed on a second surface (e.g., an upper surface or a side surface) of the printed circuit board or to be adjacent thereto to transmit or receive a single of the specific high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1701 and the external electronic device 1704 via the server 1708 coupled with the second network 1799. Each of the external electronic devices 1702 or 1704 may be a device of a same type as, or a different type, from the electronic device 1701. According to an embodiment, all or some of operations to be executed at the electronic device 1701 may be executed at one or more of the external electronic devices 1702, 1704, or 1708. For example, when the electronic device 1701 should perform a function or a service automatically, or in response to a request from a user or another device, the electronic device 1701, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1701. The electronic device 1701 may provide the outcome, with or without further processing of the outcome, as at least part of a reply to the request. To that end, a cloud computing, distributed computing, mobile edge computing (MEC), or client-server computing technology may be used, for example. The electronic device 1701, for example, may provide an ultra-low latency service by using distributed computing or mobile edge computing. In another embodiment, the external electronic device 1704 may include internet of things (IoT). The server 1708 may be an intelligent server using machine learning and/or neural networks. According to an embodiment, the external electronic device 1704 or the server 1708 may be included in the second network 1799. The electronic device 1701 may be applied to an intelligent service (e.g., a smart hole, a smart city, a smart car, or healthcare) based on the 5G communication technologies and the IoT related technologies.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1740) including one or more instructions that are stored in a storage medium (e.g., internal memory 1736 or external memory 1738) that is readable by a machine (e.g., the electronic device 1701). For example, a processor (e.g., the processor 1720) of the machine (e.g., the electronic device 1701) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities and some of multiple entities may be separately disposed on the other components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The invention claimed is:

1. A rollable electronic device comprising:
   a display structure including a fixed exposure area which is fixedly exposed to outside the rollable electronic display device, and an expandable exposure area which extends from the fixed exposure area;
   a first housing which is fixed to the display structure and corresponds to the fixed exposure area of the display structure;
   a second housing which is slidably disposed to the first housing, corresponds to the expandable exposure area of the display structure and along which the expandable exposure area of the display structure is slidable;
   a sliding driver which is fixedly disposed in the first housing and controls an opening operation and a closing operation of the rollable electronic device;
   a first tension transmitting member fixedly connected to the display structure and rotatably engaged with the sliding driver; and
   a second tension transmitting member connected to the first housing and the second housing and rotatably engaged with the sliding driver.

2. The rollable electronic device of claim 1, further comprising:
   a fixed pulley about which the second tension transmitting member is rotatably connected to the first housing, and a tension fixer which is adjacent to the fixed pulley, disposed in the first housing; and a movable pulley about which the second tension transmitting member is rotatably connected to the second housing, disposed in the second housing, wherein one end of the second tension transmitting member is fixed to the sliding driver, an opposite end of the second tension transmitting member is fixed to the tension fixer, and a portion of the second tension transmitting member which is between the one end and the opposite end extends along the fixed pulley and the movable pulley.

3. The rollable electronic device of claim 1, further comprising:

a first battery and a second battery disposed on one side of the second housing or the first housing, wherein the first battery is larger than the second battery.

4. The rollable electronic device of claim 1, wherein the second tension transmitting member is connected to a center weight of a periphery of one side of the display structure.

5. A rollable electronic device comprising:

a display structure including a fixed exposure area which is fixedly exposed to outside the rollable electronic display device. and an expandable exposure area which extends from the fixed exposure area;

a first housing which is fixed to the display structure and corresponds to the fixed exposure area of the display structure;

a second housing which is slidably disposed to the first housing, corresponds to the expandable exposure area of the display structure and along which the expandable exposure area of the display structure is slidable;

a first tension transmitting member fixedly connected to the display structure and rotatably connected to the sliding driver;

a second tension transmitting member rotatably connected to the second housing. the first housing and the sliding driver; and a sliding driver which is fixedly disposed in the first housing and controls an opening operation and a closing operation of the rollable electronic device. wherein the sliding driver includes:

a first drum around which the first tension transmitting member is windable;

a first motor which is connected to the first drum and controls rotation of the first drum;

a second drum around which the second tension transmitting member is windable; and a second motor which is connected to the second drum and controls rotation of the second drum.

6. The rollable electronic device of claim 5, further comprising:

a first reduction gear which reduces a speed of the first motor; and a second reduction gear which reduces a speed of the second motor.

7. The rollable electronic device of claim 5, wherein within the closing operation, the second tension transmitting member is unwound from the second drum in a counterclockwise direction together with the first tension transmitting member being wound on the first drum in a clockwise direction.

8. The rollable electronic device of claim 5, wherein the opening operation includes the second housing sliding away from the first housing in a second direction, and expanding the expandable exposure area, and within the opening operation, the first tension transmitting member is unwound from the first drum in a clockwise direction, together with the second tension transmitting member being wound on the second drum in the clockwise direction.

9. The rollable electronic device of claim 5, wherein the first drum and the second drum each includes spiral guide grooves within which the first tension transmitting member and the second tension transmitting member are respectively seated.

10. A rollable electronic device comprising:

a display structure including a fixed exposure area which is fixedly exposed to outside the rollable electronic display device. and an expandable exposure area which extends from the fixed exposure area;

a first housing which is fixed to the display structure and corresponds to the fixed exposure area of the display structure;

a second housing which is slidably disposed to the first housing. corresponds to the expandable exposure area of the display structure and along which the expandable exposure area of the display structure is slidable;

a first tension transmitting member fixedly connected to the display structure and rotatably connected to the sliding driver:

a second tension transmitting member rotatably connected to the second housing, the first housing and the sliding driver; and a sliding driver which is fixedly disposed in the first housing and controls an opening operation and a closing operation of the rollable electronic device, wherein the sliding driver includes:

an integrated drum to which the first tension transmitting member and the second tension transmitting member are commonly connected; and a motor which controls rotation of the integrated drum.

11. The rollable electronic device of claim 10, wherein within the closing operation, the integrated drum is rotated in a clockwise direction and pulls the first tension transmitting member together with the display structure, in a first direction, and within the opening operation, the integrated drum is rotated in a counterclockwise direction and moves the second tension transmitting member together with the second housing in a second direction which is opposite to the first direction.

12. The rollable electronic device of claim 10, wherein the first tension transmitting member and the second tension transmitting member are connected to each other on one side of the integrated drum.

13. The rollable electronic device of claim 10, wherein the integrated drum includes spiral guide grooves within which the first tension transmitting member and the second tension transmitting member are seated.

* * * * *